(12) United States Patent
Matsuo et al.

(10) Patent No.: US 12,068,235 B2
(45) Date of Patent: Aug. 20, 2024

(54) SEMICONDUCTOR DEVICE

(71) Applicant: ROHM CO., LTD., Kyoto (JP)

(72) Inventors: Masaaki Matsuo, Kyoto (JP); Yoshihisa Tsukamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 344 days.

(21) Appl. No.: 17/596,235

(22) PCT Filed: Jun. 10, 2020

(86) PCT No.: PCT/JP2020/022824
§ 371 (c)(1),
(2) Date: Dec. 6, 2021

(87) PCT Pub. No.: WO2021/002166
PCT Pub. Date: Jul. 1, 2021

(65) Prior Publication Data
US 2022/0319975 A1 Oct. 6, 2022

(30) Foreign Application Priority Data
Jul. 2, 2019 (JP) .................................. 2019-123472

(51) Int. Cl.
*H01L 23/498* (2006.01)
*H01L 23/00* (2006.01)
(Continued)

(52) U.S. Cl.
CPC ...... *H01L 23/49844* (2013.01); *H01L 23/481* (2013.01); *H01L 23/49811* (2013.01);
(Continued)

(58) Field of Classification Search
CPC ............. H01L 23/49844; H01L 23/481; H01L 23/49811; H01L 25/072; H01L 24/48
See application file for complete search history.

(56) References Cited

U.S. PATENT DOCUMENTS

2019/0295990 A1\* 9/2019 Hayashi .................. H01L 24/49

FOREIGN PATENT DOCUMENTS

JP 2009-158787 A 7/2009
WO 2017/209191 A1 12/2017

OTHER PUBLICATIONS

International Search Report issued in PCT/JP2020/022824, Sep. 15, 2020 (2 pages).

(Continued)

*Primary Examiner* — Marc Anthony Armand
(74) *Attorney, Agent, or Firm* — HSML P.C.

(57) ABSTRACT

Semiconductor device A1 includes: semiconductor element 1 turning on and off connection between drain electrode 11 and source electrode 12; semiconductor element 2 turning on and off connection between drain electrode 21 and source electrode 22; metal component 31 with semiconductor element 1 mounted; metal component 32 with semiconductor element 2 mounted; and conductive substrate 4 including wiring layers 411, 412 with insulating layer 421 between them. Wiring layer 411 includes power terminal section 401 connected to drain electrode 11. Wiring layer 412 includes power terminal section 402 connected to source electrode 22. Power terminal sections 401, 402 and insulating layer 421 overlap with each other as viewed in z direction. Conductive substrate 4 surrounds semiconductor elements 1, 2 as viewed in z direction, while overlapping with a portion between metal components 31, 32 as viewed in z direction.

19 Claims, 17 Drawing Sheets

(51) Int. Cl.
*H01L 23/48* (2006.01)
*H01L 25/07* (2006.01)
(52) U.S. Cl.
CPC ............ *H01L 25/072* (2013.01); *H01L 24/48* (2013.01); *H01L 2224/48091* (2013.01); *H01L 2224/48245* (2013.01); *H01L 2924/1815* (2013.01); *H01L 2924/182* (2013.01); *H01L 2924/186* (2013.01); *H01L 2924/30107* (2013.01)

(56) References Cited

OTHER PUBLICATIONS

Office Action received in the corresponding Japanese Patent application, Mar. 5, 2024, and machine translation (8 pages).

* cited by examiner

FIG.2
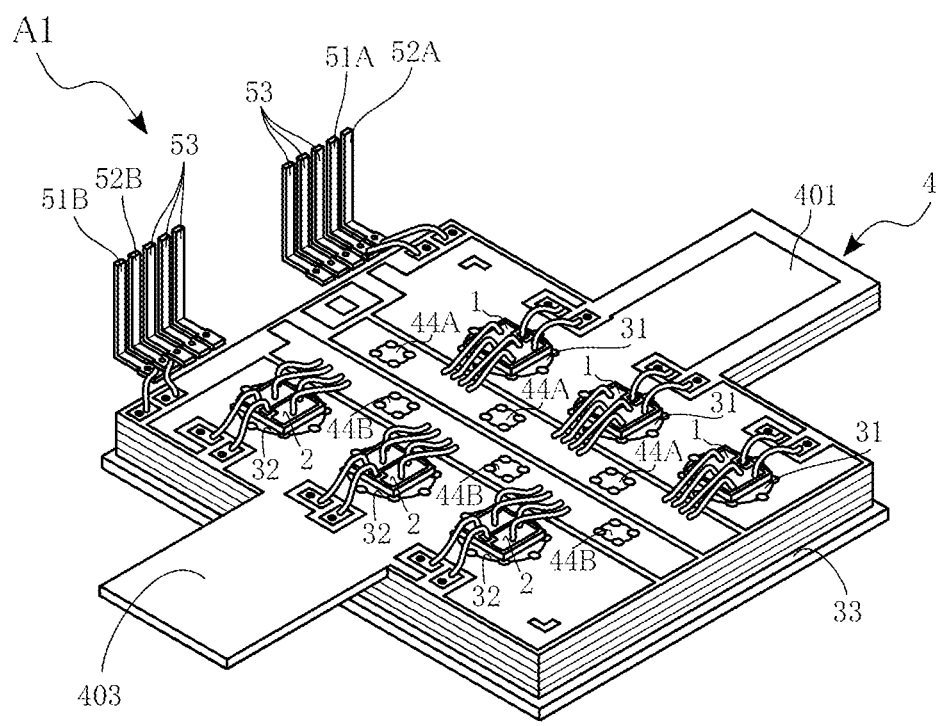
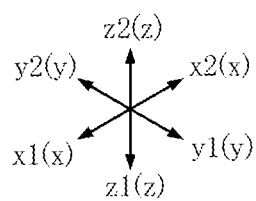

SEMICONDUCTOR DEVICE

TECHNICAL FIELD

The present disclosure relates to semiconductor devices.

BACKGROUND ART

Conventionally, semiconductor devices including power semiconductor elements, such as metal oxide semiconductor field effect transistors (MOSFETs) and insulated gate bipolar transistors (IGBTs), have been known. For example, Patent Document 1 discloses a semiconductor device including two serially connected semiconductor elements. Such a semiconductor device may be mounted on a circuit substrate of an electronic device and used for a power circuit (e.g., DC/DC converter or inverter) or a motor driving circuit.

PRIOR ART DOCUMENT

Patent Document

Patent Document 1: JP-A-2009-158787

SUMMARY OF THE INVENTION

Problem to be Solved by the Invention

With recent advancement of electronic devices to achieve further energy saving and higher performance, semiconductor devices are required to reduce power consumption and improve switching responsivity. An effective way to achieve lower power consumption and higher switching responsivity is to reduce the inductance.

The present disclosure has been conceived in view of the above circumstances and aims to provide semiconductor devices configured to have lower inductance.

Means to Solve the Problem

A semiconductor device according to the present disclosure includes: a first semiconductor element including a first electrode, a second electrode and a third electrode, and controlled to turn on and off a connection between the first electrode and the second electrode by a first driving signal inputted to the third electrode; a second semiconductor element including a fourth electrode, a fifth electrode and a sixth electrode, and controlled to turn on and off a connection between the fourth electrode and the fifth electrode by a second driving signal inputted to the sixth electrode; a first metal component on which the first semiconductor element is mounted; a second metal component on which the second semiconductor element is mounted, the second metal component being spaced apart from the first metal component; and a conductive substrate including a first wiring layer and a second wiring layer laminated with a first insulating layer interposed between them. The first wiring layer includes a first power terminal section electrically connected to the first electrode. The second wiring layer includes a second power terminal section electrically connected to the fifth electrode. The first power terminal section, the second power terminal section and the first insulating layer overlap with each other as viewed in a first direction that is a thickness direction of the conductive substrate. The conductive substrate surrounds the first semiconductor element and the second semiconductor element as viewed in the first direction and overlaps with a portion between the first metal component and the second metal component as viewed in the first direction.

Advantages of the Invention

The present disclosure can provide a semiconductor device having a lower inductance.

BRIEF DESCRIPTION OF THE DRAWINGS

FIG. 2 is a view similar to the perspective view of FIG. 1 but omitting a resin package.

MODE FOR CARRYING OUT THE INVENTION

Figure 1:
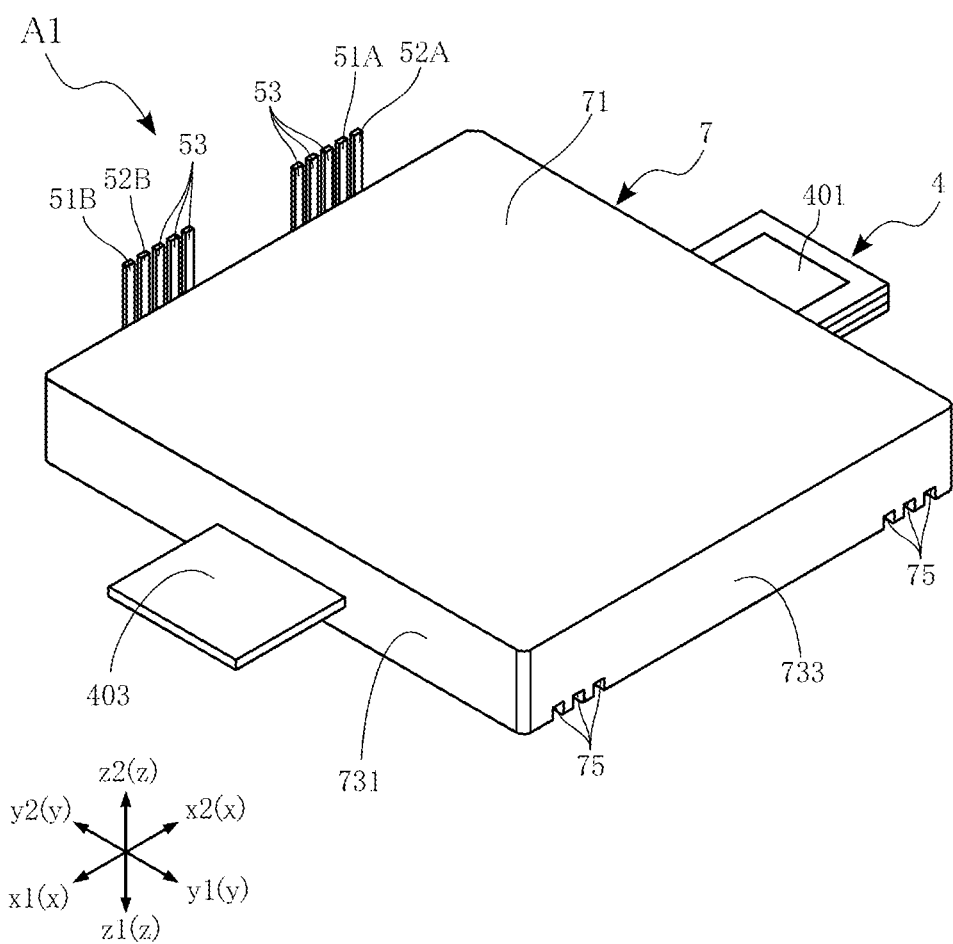
FIG. 1 is a perspective view of a semiconductor device according to a first embodiment.

The following describes preferred embodiments of semiconductor devices according to the present disclosure with reference to the drawings. In the figures, the same or similar elements are denoted by the same reference signs, and description thereof is omitted.

FIGS. 1 to 9 are views for illustrating a semiconductor device A1 according to a first embodiment. The semiconductor device A1 includes a plurality of semiconductor elements 1, a plurality of semiconductor elements 2, a plurality of metal components 31 and 32, an insulating substrate 33, a conductive substrate 4, a pair of signal terminals 51A and 51B, a pair of sensing terminals 52A and 52B, a plurality of dummy terminals 53, a plurality of connecting members 6A to 6J, and a resin package 7.

Figure 3:
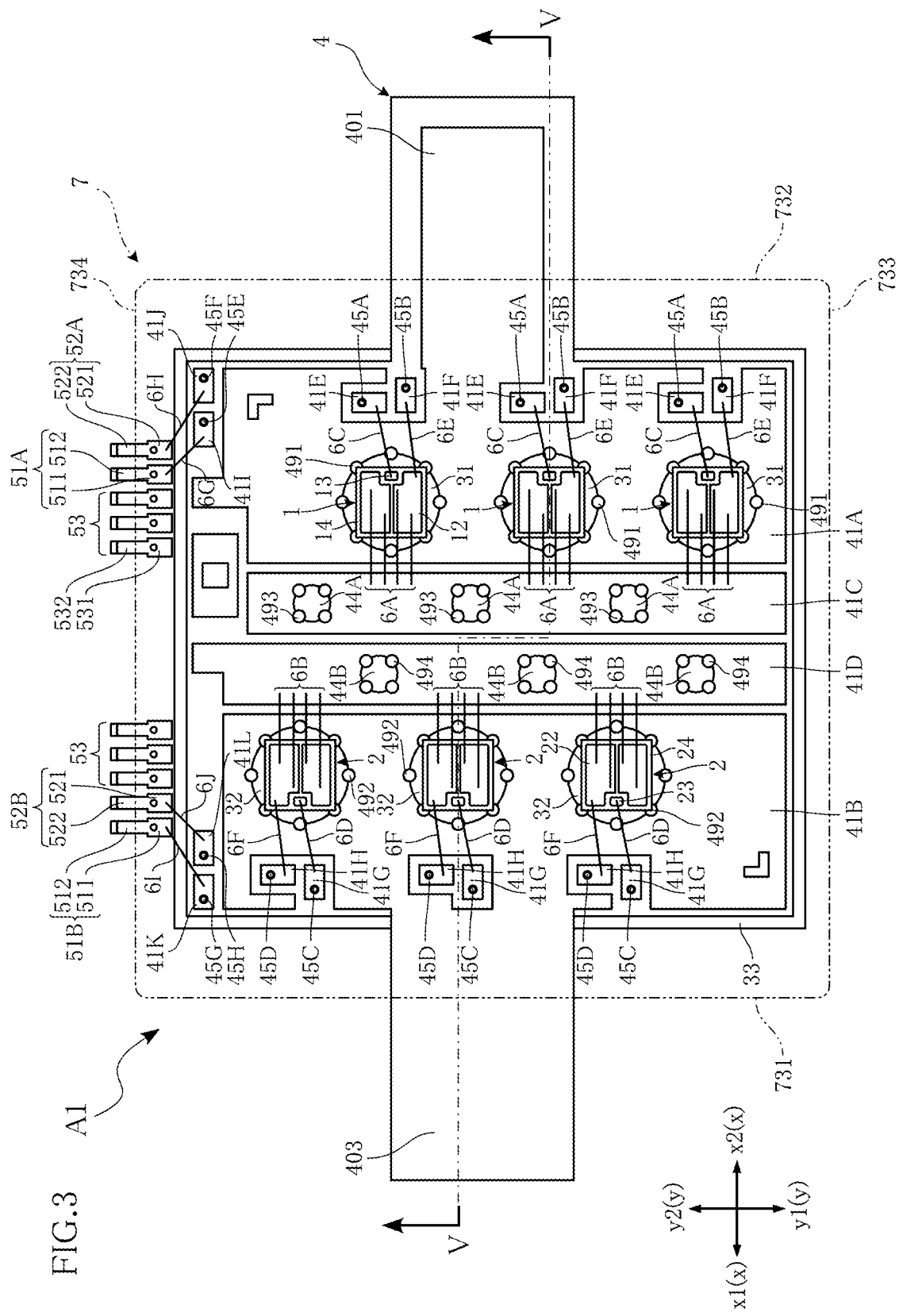
FIG. 3 is a plan view of the semiconductor device according to the first embodiment.
Figure 4:
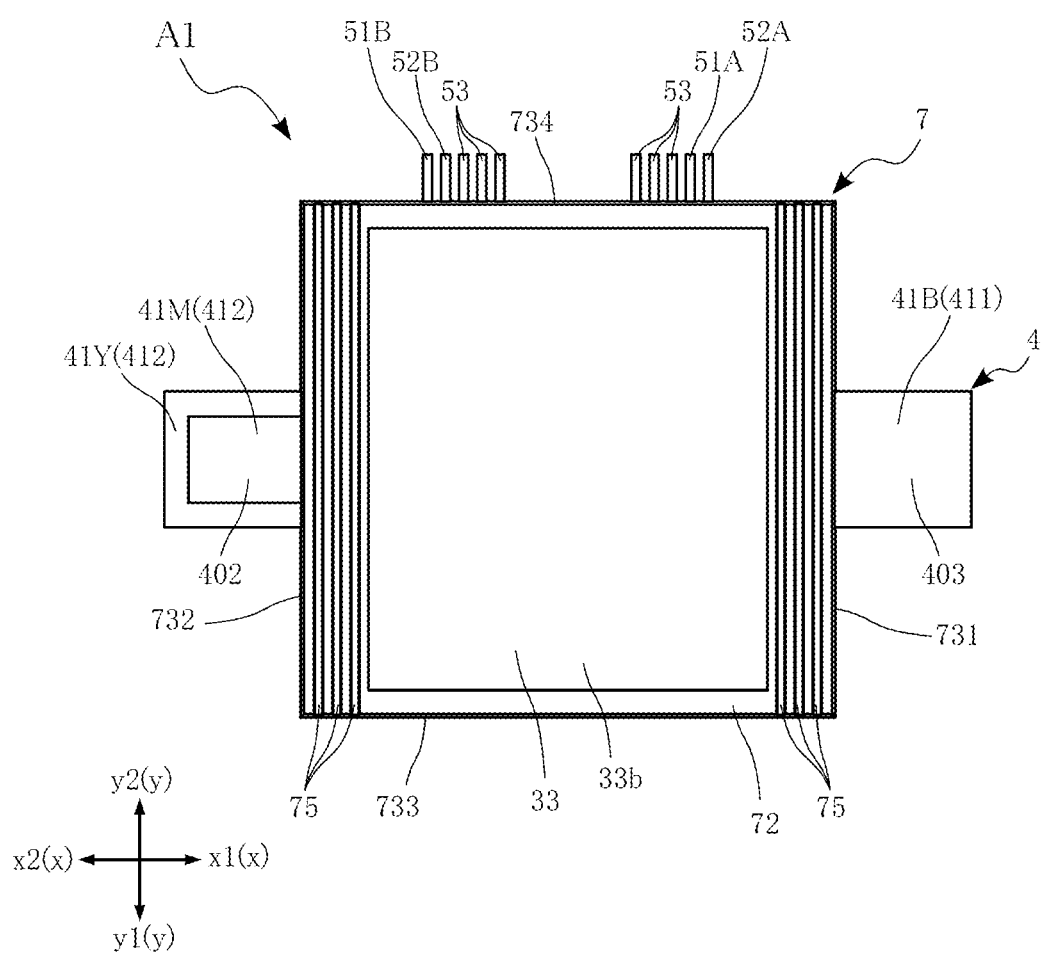
FIG. 4 is a bottom view of the semiconductor device according to the first embodiment.
Figure 5:
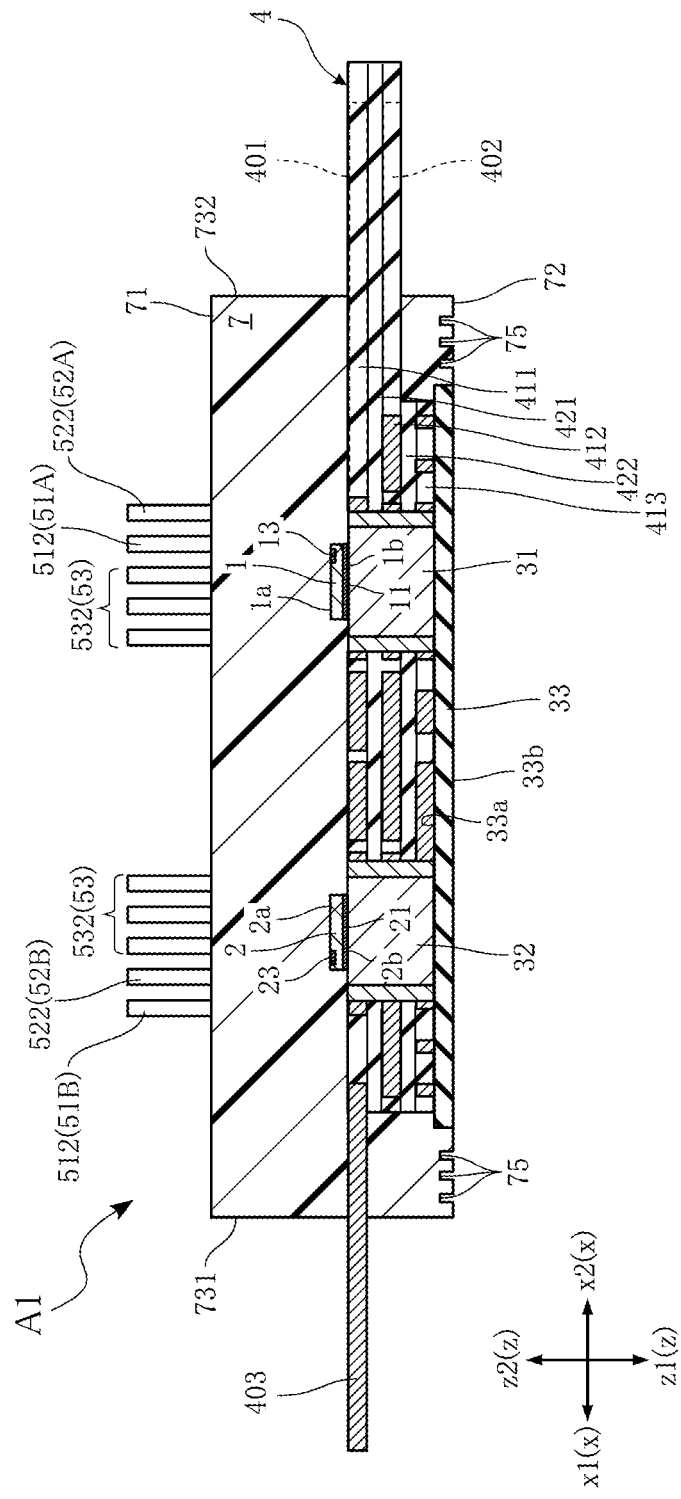
FIG. 5 is a sectional view taken along line V-V of FIG. 3.

FIG. 1 is a perspective view of the semiconductor device A1. FIG. 2 is a view similar to the perspective view of FIG. 1 but omitting the resin package 7. FIG. 3 is a plan view of the semiconductor device A1, with the resin package 7 indicated by phantom lines (dash-dotted lines). FIG. 4 is a bottom view of the semiconductor device A1. FIG. 5 is a sectional view taken along line V-V of FIG. 3. In FIG. 5, the connecting members 6A to 6J are omitted. FIGS. 6 to 9 show the detailed structure of the conductive substrate 4.

For convenience, three directions perpendicular to each other are defined as x, y and z directions. The z direction corresponds to the thickness direction of the semiconductor device A1. The x direction is the horizontal direction of the semiconductor device A1 in plan view (see FIG. 3). The y direction is the vertical direction of the semiconductor device A1 in plan view (see FIG. 3). In particular, one of the x directions is defined as x1 direction and the other as x2 direction. Similarly, one of the y directions is defined as y1 direction and the other as y2 direction, and one of the z directions is defined as z1 direction and the other as z2 direction. In the following description, a plan view is what is viewed in the z direction. The z direction may correspond to a first direction recited in the claims, and the y direction may correspond to a second direction recited in the claims.

The semiconductor device A1 is a power conversion device (power module) for use in drive sources of motors, inverters of various electronic devices, and DC/DC converters of various electronic devices. The semiconductor device A1 may constitute a half-bridge switching circuit.

The semiconductor elements 1 and 2 may be MOSFETs, for example. The semiconductor elements 1 and 2, however, are not limited to MOSFET and may alternatively be switching elements, including field-effect transistors, such as metal-insulator-semiconductor FETs (MISFET), or bipolar transistors, such as IGBTs. Each of the semiconductor elements 1 and 2 may be an N-channel MOSFET or a P-channel MOSFET. The semiconductor elements 1 and 2 are made of a semiconductor material, which typically is silicon carbide (SiC). The semiconductor material is not limited to SiC, and may be silicon (Si), gallium arsenide (GaAs), gallium nitride (GaN) or gallium oxide ($Ga_2O_3$), for example.

As shown in FIG. 5, each semiconductor element 1 has an element obverse surface 1a and an element reverse surface 1b. The element obverse surface 1a and the element reverse surface 1b are spaced apart from each other in the z direction, with the element obverse surface 1a facing in the z2, and the element reverse surface 1b in the z1. The element reverse surface 1b faces a metal component 31.

As shown in FIGS. 3 and 5, each semiconductor element 1 includes a drain electrode 11, a source electrode 12, a gate electrode 13 and an insulating film 14.

As shown in FIGS. 3 and 5, in each semiconductor element 1, the drain electrode 11 is disposed and exposed on the element reverse surface 1b. The drain electrode 11 may correspond to a first electrode recited in the claims.

As shown in FIG. 3, in each semiconductor element 1, the source electrode 12 is disposed and exposed on the element obverse surface 1a. The source electrode 12 has one or more regions exposed on the element obverse surface 1a. In FIG. 3, the source electrode 12 has two exposed regions. The source electrode 12 may correspond to a second electrode recited in the claims.

As shown in FIGS. 3 and 5, in each semiconductor element 1, the gate electrode 13 is disposed and exposed on the element obverse surface 1a. A driving signal (voltage signal) for driving the semiconductor element 1 is inputted to the gate electrode 13. The driving signal may correspond to a first driving signal recited in the claims. In plan view, the gate electrode 13 is smaller than either of the two exposed parts of the source electrode 12. The gate electrode 13 may correspond to a third electrode recited in the claims.

As shown in FIG. 3, in each semiconductor element 1, the insulating film 14 is disposed and exposed on the element obverse surface 1a. The insulating film 14 surrounds the source electrode 12 and the gate electrode 13 in plan view. The insulating film 14 insulates the source electrode 12 and the gate electrode 13 from each other. The insulating film 14 is composed of, for example, a silicon dioxide ($SiO_2$) layer, a silicon nitride ($SiN_4$) layer and a polybenzoxazole layer laminated in the stated order, with the polybenzoxazole layer being the outermost layer on the element obverse surface 1a of the semiconductor element 1. The insulating film 14 may include a polyimide layer instead of the polybenzoxazole layer.

Each semiconductor element 1 is controlled to turn on and off the connection between the drain electrode 11 and the source electrode 12, by a driving signal inputted to the gate electrode 13. The semiconductor element 1 may correspond to a first semiconductor element recited in the claims.

As shown in FIG. 5, each semiconductor element 2 has an element obverse surface 2a and an element reverse surface 2b. The element obverse surface 2a and the element reverse surface 2b are spaced apart from each other in the z direction, with the element obverse surface 2a facing in the z2, and the element reverse surface 2b in the z1 direction. The element reverse surface 2b faces a metal component 32.

As shown in FIGS. 3 and 5, each semiconductor element 2 includes a drain electrode 21, a source electrode 22, a gate electrode 23 and an insulating film 24.

As shown in FIGS. 3 and 5, in each semiconductor element 2, the drain electrode 21 is disposed and exposed on the element reverse surface 2b. The drain electrode 21 may correspond to a fourth electrode recited in the claims.

As shown in FIG. 3, in each semiconductor element 2, the source electrode 22 is disposed and exposed on the element obverse surface 2a. The source electrode 22 has one or more region exposed on the element obverse surface 2a. In FIG. 3, the source electrode 22 has two exposed regions. The source electrode 22 may correspond to a fifth electrode recited in the claims.

As shown in FIGS. 3 and 5, in each semiconductor element 2, the gate electrode 23 is disposed and exposed on the element obverse surface 2a and exposed on the element obverse surface 2a. A driving signal (voltage signal) for driving the semiconductor element 2 is inputted to the gate electrode 23. The driving signal may correspond to a second driving signal recited in the claims. In plan view, the gate electrode 23 is smaller than either of the two divided parts of the source electrode 22. The gate electrode 23 may correspond to a sixth electrode recited in the claims.

As shown in FIG. 3, in each semiconductor element 2, the insulating film 24 is disposed and exposed on the element obverse surface 2a and exposed on the element obverse surface 2a. The insulating film 24 surrounds the source electrode 22 and the gate electrode 23 in plan view. The insulating film 24 insulates the source electrode 22 and the gate electrode 23 from each other. The insulating film 24 may be composed of, for example, a silicon dioxide ($SiO_2$) layer, a silicon nitride ($SiN_4$) layer and a polybenzoxazole layer laminated in the stated order, with the polybenzoxazole layer being the outermost layer on the element obverse surface 2a of the semiconductor element 2. The insulating film 24 may include a polyimide layer instead of the polybenzoxazole layer.

Each semiconductor element 2 is controlled to turn on and off the connection between the drain electrode 21 and the source electrode 22, by a driving signal inputted to the gate electrode 23. The semiconductor element 2 may correspond to a second semiconductor element recited in the claims.

As described earlier, the semiconductor device A1 constitutes a half-bridge switching circuit. The semiconductor elements 1 constitute an upper arm circuit of the switching circuit, whereas the semiconductor elements 2 constitute the lower arm circuit of the switching circuit. As shown in FIGS. 2 and 3, the semiconductor device A1 includes three semiconductor elements 1 and three semiconductor elements 2. Note, however, that the numbers of semiconductor elements 1 and 2 are not limited to this example, and any number can be selected depending on the properties required for the semiconductor device A1.

Each metal component 31 is a conductive member in the shape of a pillar. In the present embodiment, each metal component 31 is generally circular in cross section perpendicular to the z direction. In short, each metal component 31 is in the shape of a circular cylinder. Note, however, that the shape of the cross section is not limited to generally circular and may be generally oval or polygonal. As shown in FIG. 3, each metal component 31 has a plurality of recesses in the peripheral edge in plan view. The number of recesses is not specifically limited. The metal components 31 may be made of Cu or an alloy of Cu, for example. Each metal component 31 is fitted into the conductive substrate 4 (a through hole 43A, which will be described later) to extend through the conductive substrate 4 in the z direction. The semiconductor elements 1 are mounted on the metal components 31 on a one-to-one basis. In plan view, each semiconductor element 1 overlaps with the corresponding metal component 31. The metal component 31 may correspond to a first metal component recited in the claims.

Each metal component 32 is a conductive member in the shape of a pillar. In the present embodiment, each metal component 32 is generally circular in cross section perpendicular to the z direction. In short, each metal component 32 is in the shape of a circular cylinder. Note, however, that the shape of the cross section is not limited to generally circular and may be generally oval or polygonal. As shown in FIG. 3, each metal component 32 has a plurality of recesses in the peripheral edge in plan view. The number of recesses is not specifically limited. The metal components 32 may be made of Cu or an alloy of Cu, for example. Each metal component 32 is fitted into the conductive substrate 4 (a through hole 43B, which will be described later) to extend through the conductive substrate 4 in the z direction. The semiconductor elements 2 are mounted on the metal components 32 on a one-to-one basis. In plan view, each semiconductor element 2 overlaps with the corresponding metal component 32. The metal component 32 may correspond to a second metal component recited in the claims.

As shown in FIGS. 2, 3 and 5, the insulating substrate 33 is a base on which the metal components 31 and 32 and the conductive substrate 4 are disposed. The insulating substrate 33 may be made of ceramic having excellent pyroconductivity. Examples of such a ceramic material include aluminum nitride (AlN). In the present embodiment, the insulating substrate 33 is rectangular in plan view. The structure of the insulating substrate 33 is not limited to the example shown in FIGS. 2 and 3 to 5. Depending on the specifications of the semiconductor device A1, the insulating substrate 33 may be appropriately modified as to the shape, dimensions and number, for example.

As shown in FIG. 5, the insulating substrate 33 has a substrate obverse surface 33a and a substrate reverse surface 33b. The substrate obverse surface 33a and the substrate reverse surface 33b are spaced apart from each other in the z direction, with the substrate obverse surface 33a facing in the z2 direction, and the substrate reverse surface 33b in the z1 direction. As shown in FIGS. 4 and 5, the substrate reverse surface 33b is exposed from the resin package 7. The substrate reverse surface 33b may be connected to a cooling device, such as a heatsink, not shown in the figures.

The conductive substrate 4 serves as the internal wiring of the semiconductor device A1. As shown in FIG. 4, the conductive substrate 4 is disposed on the substrate obverse surface 33a of the insulating substrate 33 and bonded to the insulating substrate 33 by a bonding member (not shown). The bonding member may be made of either a conductive material or an insulating material. As shown in FIG. 3 or in plan view, the conductive substrate 4 is configured to include portions surrounding the semiconductor elements 1, 2 as a whole and other portions located between the metal components 31, 32. As understood from FIG. 5, the conductive substrate 4 as viewed in the x direction does not overlap with the semiconductor elements 1, 2. Likewise, as viewed in the y direction, the conductive substrate 4 does not overlap with the semiconductor elements 1, 2.

The conductive substrate 4 is a laminate composed of a plurality of wiring layers and a plurality of insulating layers alternately laminated in the z direction. In the present embodiment, the conductive substrate 4 includes three wiring layers 411, 412 and 413 and two insulating layers 421 and 422. Note, however, that the number of wiring layers and the number of insulating layers are not limited as mentioned above and can be appropriately modified depending on the specifications of the semiconductor device A1.

Figure 6:
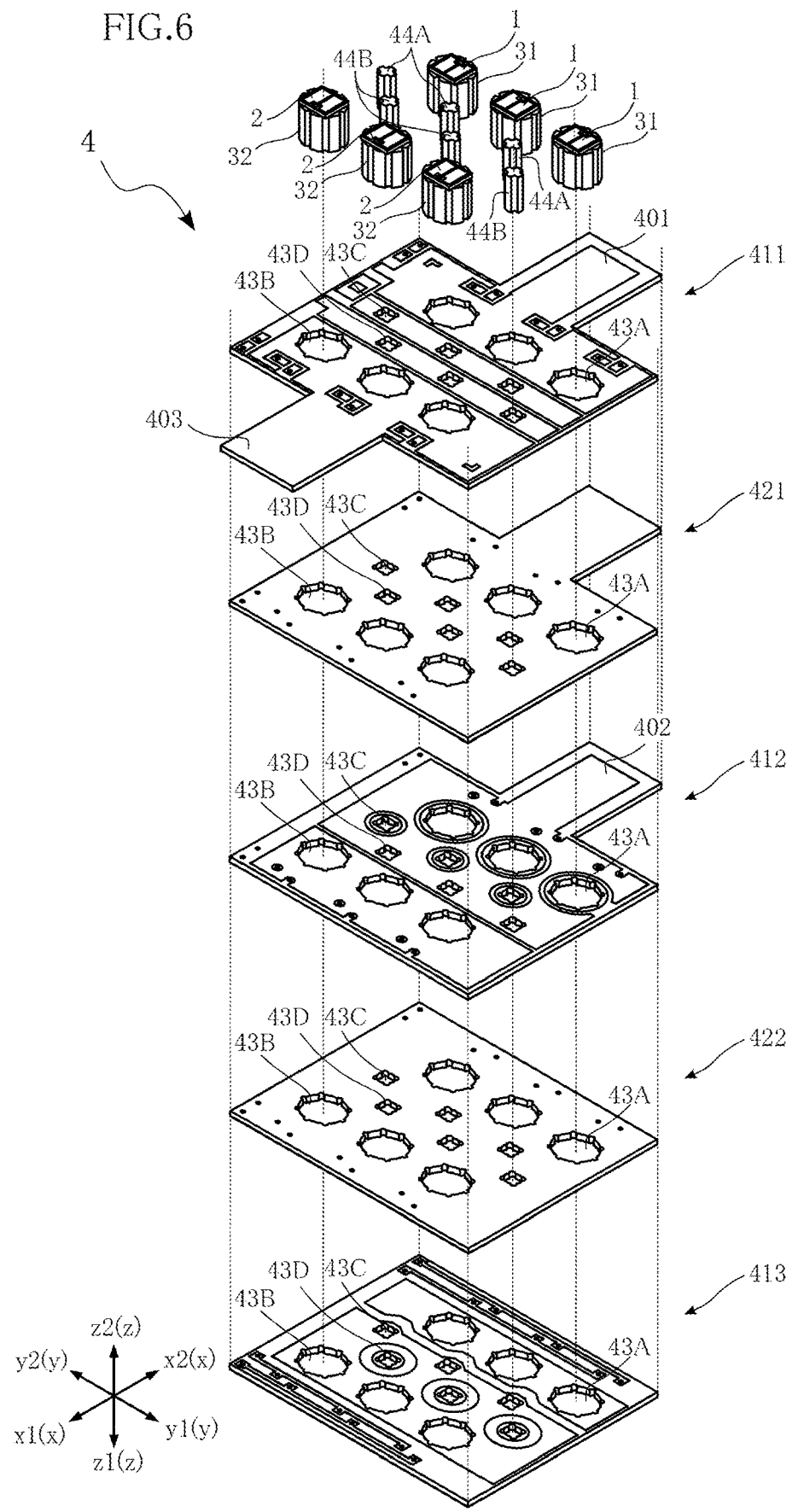
FIG. 6 is an exploded perspective view of a conductive substrate according to the first embodiment.
Figure 7:
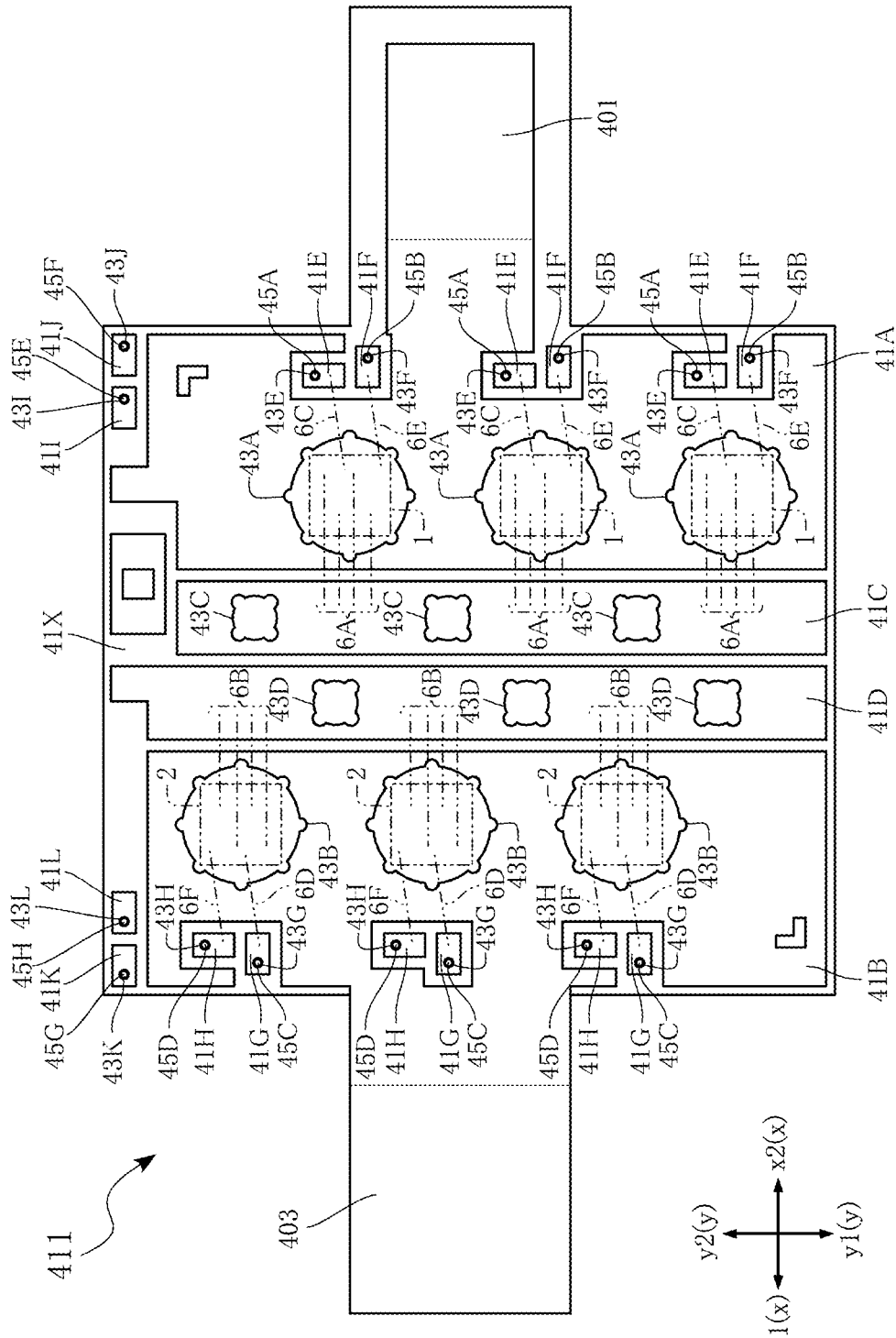
FIG. 7 is a plan view showing one of a plurality of wiring layers of the conductive substrate according to the first embodiment.
Figure 8:
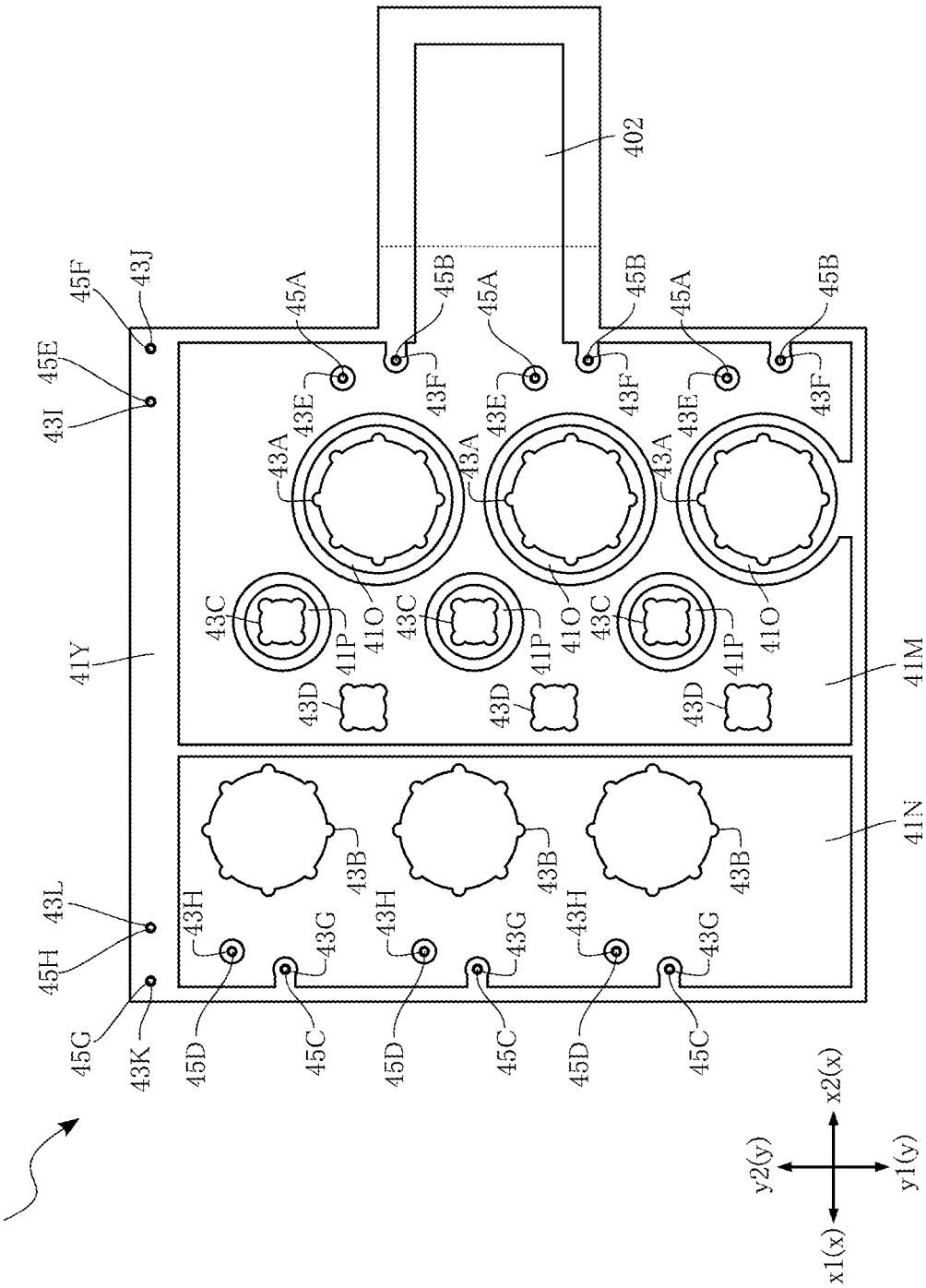
FIG. 8 is a plan view showing one of the wiring layers of the conductive substrate according to the first embodiment.
Figure 9:
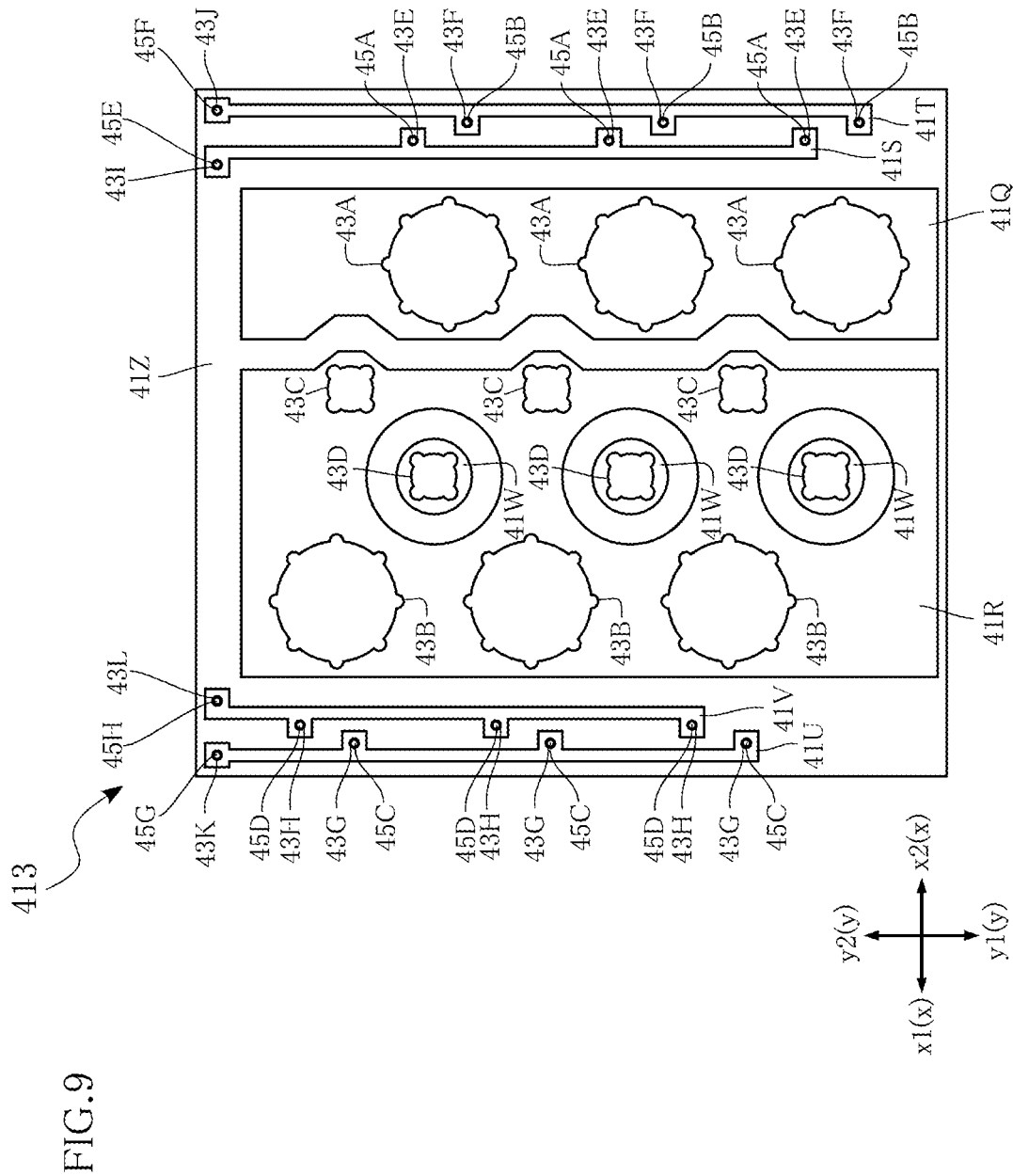
FIG. 9 is a plan view showing one of the wiring layers of the conductive substrate according to the first embodiment.

The conductive substrate 4 may have a laminated structured as shown in FIGS. 6 to 9. FIG. 6 is an exploded perspective view of the conductive substrate 4. For convenience, FIG. 6 also shows the semiconductor elements 1 and 2 and the metal components 31 and 32. FIG. 7 is a plan view of the wiring layer 411. FIG. 8 is a plan view of the wiring layer 412. FIG. 9 is a plan view of the wiring layer 413. In FIGS. 7 to 9, the insertion members 44A and 44B are omitted.

As shown in FIGS. 5 and 6, the wiring layer 411 is the outermost layer of the conductive substrate 4 in the z2 direction. The wiring layer 413 is the outermost layer of the conductive substrate 4 in the z1 direction. The wiring layer 412 is located between the wiring layer 411 and the wiring layer 413 in the z direction. As shown in FIGS. 5 and 6, the insulating layer 421 is interposed between the wiring layer 411 and the wiring layer 412 in the z direction to insulate them. The insulating layer 422 is interposed between the wiring layer 412 and the wiring layer 413 to insulate them. In the present embodiment, the wiring layer 411 may correspond to a first wiring layer recited in the claims, the wiring layer 412 to a second wiring layer, and the wiring layer 413 to a third wiring layer. In addition, the insulating layer 421 may correspond to a first insulating layer recited in the claims, and the insulating layer 422 to a second insulating layer.

As shown in FIG. 7, the wiring layer 411 includes a plurality of conductor parts 41A to 41L and an insulating part 41X. The conductor parts 41A to 41L are spaced apart from each other and insulated by the insulating part 41X. In the z direction, each of the conductor parts 41A to 41L has substantially the same dimension and position as the insulating part 41X. Note that the wiring layer 411 may be without the insulating part 41X. Yet, providing the insulating part 41X is preferred for preventing accidental short-circuiting of the conductor parts 41A and 41L.

As shown in FIG. 8, the wiring layer 412 includes a plurality of conductor parts 41M to 41P and an insulating part 41Y. The conductor parts 41M to 41P are spaced apart from each other and insulated by the insulating part 41Y. Each of the conductor parts 41M to 41P has substantially the same dimension and position in the z direction as the insulating part 41Y. Note that the wiring layer 412 may be without the insulating part 41Y. Yet, providing the insulating part 41Y is preferred for preventing accidental short-circuiting of the conductor parts 41M and 41P.

As shown in FIG. 9, the wiring layer 413 includes a plurality of conductor parts 41Q to 41W and an insulating part 41Z. The conductor parts 41Q to 41W are spaced apart from each other and insulated by the insulating part 41Z. Each of the conductor parts 41Q to 41W has substantially the same dimension and position in the z direction as the insulating part 41Z. Note that the wiring layer 413 may be without the insulating part 41Z. Yet, providing the insulating part 41Z is preferred for preventing accidental short-circuiting of the conductor parts 41Q and 41W.

The conductor parts 41A to 41W may be metal plates containing copper (Cu) (thick copper plates), for example. The insulating parts 41X to 41Z and the insulating layers 421 and 422 may be made of prepreg, for example. All the conductor parts 41A to 41W have substantially the same dimension in the z direction. The conductor parts 41A to 41W may be greater in the z direction than 125 µm (which is a typical thickness of a wiring pattern in a printed circuit board (Cu thickness)). Preferably, the conductor parts 41A to 41W are thicker in the z direction than the semiconductor elements 1 and 2 and also thicker than the insulating layers 421 and 422. In other words, each of the wiring layers 411, 412 and 413 is thicker in the z direction than the semiconductor elements 1 and 2 and also thicker than the insulating layers 421 and 422. Note, however, that the conductor parts 41A to 41W may be thinner in the z direction than the insulating layers 421 and 422.

The structure of the conductive substrate 4 is not limited to the example shown in FIGS. 6 to 9. The conductive pats 41A to 41W can be modified as to, for example, the shapes, dimensions and arrangements, depending on the specifications of the semiconductor device A1.

As shown in FIGS. 1 to 5, the conductive substrate 4 includes three power terminal sections 401, 402 and 403. The power terminal sections 401, 402 and 403 are portions exposed from the resin package 7 and serve as external terminals of the semiconductor device A1. In plan view as shown in FIG. 3, the two power terminal sections 401 and 402 protrude from the resin package 7 in the x2 direction, and the power terminal section 403 protrudes from the resin package 7 in the x1 direction. The two power terminal sections 401 and 402 are located opposite from the power terminal section 403 across the resin package 7 in the x direction.

As shown in FIG. 7, the power terminal section 401 is a portion of the conductor part 41A (the wiring layer 411). The portion of the conductor part 41A forming the power terminal section 401 protrudes from the resin package 7 in the x2 direction. As shown in FIG. 8, the power terminal section 402 is a portion of the conductor part 41M (the wiring layer 412). The portion of the conductor part 41M forming the power terminal section 402 protrudes from the resin package 7 in the x2 direction. As shown in FIG. 7, the power terminal section 403 is a portion of the conductor part 41B (the wiring layer 411). The portion of the conductor part 41B forming the power terminal section 403 protrudes from the resin package 7 in the x1 direction. The two power terminal sections 401 and 402 overlap with each other in plan view.

As shown in FIGS. 5 and 6, the insulating layer 421 is interposed between the power terminal section 401 and the power terminal section 402 in the z direction. The power terminal section 401 is exposed to the outside of the semiconductor device A1 at the surface facing in the z2 direction, and in contact with the insulating layer 421 at the surface facing in the z1 direction. The power terminal section 402 is in contact with the insulating layer 421 at surface facing in the z2 direction, and exposed to the outside of the semiconductor device A1 at the surface facing in the z1 direction.

A DC power source may be connected between the two power terminal sections 401 and 402 for supplying a source voltage (DC voltage). The power terminal section 401 functions as a P terminal connected to the positive terminal of the DC power source, and the power terminal section 402 as an N terminal connected to the negative terminal of the DC power source. The DC voltage applied at the two power terminal sections 401 and 402 is converted into AC voltage by switching operations of the semiconductor elements 1 and 2. The resulting AC voltage is applied to the power terminal section 403. The power terminal section 403 serves as an output terminal (OUT terminal) for outputting the converted AC voltage. The power terminal section 401, the power terminal section 402 and the power terminal section 403 may correspond to a first power terminal section, a second terminal section and a third terminal section recited in the claims, respectively.

As shown in FIGS. 6 to 9, the conductive substrate 4 has a plurality of through holes 43A to 43L. The through holes 43A to 43L are formed through the conductive substrate 4 in the thickness direction of the conductive substrate 4 (z direction). In other words, the through holes 43A to 43L extend in the z direction through the wiring layers 411, 412 and 413 and the insulating layers 421 and 422. As shown in FIGS. 6 to 9, the conductive substrate 4 also includes a plurality of insertion members 44A and 44B and a plurality of conductive through-hole vias 45A to 45H.

The through holes 43A extend in the z direction through the conductor part 41A of the wiring layer 411, the conductor part 41M of the wiring layer 412, and the conductor part 41Q of the wiring layer 413. Each through hole 43A has a metal component 31 inserted therein. The metal component 31 is inserted through (fitted into) the through hole 43A by, for example, press fitting. In the present embodiment, the through hole 43A may correspond to a first through hole recited in the claims.

As shown in FIGS. 6 to 9, each through hole 43A may be generally circular in plan view. As shown in FIGS. 6 to 9, each through hole 43A has a plurality of recesses formed in the inner surface. In the present embodiment, each through hole 43A defines, except at the recesses, a generally circular shape having a diameter that is substantially equal to or larger than the diameter of the circular shape defined by a metal component 31 except at the recesses. In plan view, each through hole 43A is larger than the corresponding semiconductor element 1 and overlaps with the entire semiconductor element 1.

As shown in FIG. 3, when each metal component 31 is inserted through the corresponding through hole 43A, a plurality of out-of-contact spaces 491 are formed between the inner surface of the through hole 43A and the side surface of the metal component 31 by the respective recesses. In the example shown in FIG. 3, each out-of-contact space 491 has a tubular shape with a circular cross section perpendicular to the z direction. Each out-of-contact space 491 is filled with solder, for example. Providing the out-of-contact spaces 491 filled with solder can increase the bonding strength between the conductive substrate 4 and the metal components 31 and electrically connect the metal components 31 and the wiring layers 411 to 413. Ideally, no gap is formed except at the recesses, as the metal components 31 and the through holes 43A are designed to have the same diameter in plan view. In practice, however, slight gaps may be formed due to manufacturing error. In addition, for allowing easy insertion of the metal components 31, the through holes 43A may be designed to have a larger diameter in plan view than the diameter of the metal components 31 in plan view. This structure also results in forming slight gaps. In any case, such gaps can reduce the bonding strength and cause conduction failure. This, however, is addressed by providing the out-of-contact spaces 491 and filling the out-of-contact spaces 491 with solder. At the time of filling the out-of-contact spaces 491 with solder, the solder also flows into the gaps. As a result, the gaps are filled with solder, preventing reduction of the bonding strength and conduction failure between the metal components 31 and the wiring layers 411 to 413 (the conductive substrate 4).

The through holes 43B extend in the z direction through the conductor part 41B of the wiring layer 411, the conductor part 41N of the wiring layer 412 and the conductor part 41R of the wiring layer 413. Each through hole 43B has a metal component 32 inserted therein. The metal component 32 is inserted through (fitted into) the through hole 43B by, for example, press fitting. In the present embodiment, the through hole 43B may correspond to a second through hole recited in the claims.

As shown in FIGS. 6 to 9, each through hole 43B may be generally circular in plan view. As shown in FIGS. 6 to 9, each through hole 43B has a plurality of recesses formed in the inner surface. In the present embodiment, each through hole 43B defines, except at the recesses, a generally circular shape having a diameter that is substantially equal to or larger than the diameter of the circular shape defined by a metal component 32 except at the recesses. In plan view each through hole 43B is larger than the corresponding semiconductor element 2 and overlaps with the entire semiconductor element 2.

As shown in FIG. 3, when each metal component 32 is inserted through the corresponding through hole 43B, a plurality of out-of-contact spaces 492 are formed between the inner surface of the through hole 43B and the side surface of the metal component 32 by the respective recesses. In the example shown in FIG. 3, each out-of-contact space 492 has a tubular shape with a circular cross section perpendicular to the z direction. Each out-of-contact space 492 is filled with solder, for example. Similarly to the out-of-contact spaces 491, providing the out-of-contact spaces 492 filled with solder can increase the bonding strength between the conductive substrate 4 and the metal components 32 and electrically connecting the metal components 32 and the wiring layers 411 to 413.

The through holes 43C extend in the z direction through the conductor part 41C of the wiring layer 411, the conductor parts 41P of the wiring layer 412 and the conductor part 41R of the wiring layer 413.

The through holes 43D extend in the z direction through the conductor part 41D of the wiring layer 411, the conductor part 41M of the wiring layer 412 and the conductor parts 41W of the wiring layer 413.

The through holes 43E extend in the z direction through the conductor parts 41E of the wiring layer 411, the insulating part 41Y of the wiring layer 412 and the conductor part 41S of the wiring layer 413.

The through holes 43F extend in the z direction through the conductor parts 41F of the wiring layer 411, the insulating part 41Y of the wiring layer 412 and the conductor part 41T of the wiring layer 413.

The through holes 43G extend in the z direction through the conductor parts 41G of the wiring layer 411, the insulating part 41Y of the wiring layer 412 and the conductor part 41U of the wiring layer 413.

The through holes 43H extend in the z direction through the conductor parts 41H of the wiring layer 411, the insulating part 41Y of the wiring layer 412 and the conductor part 41V of the wiring layer 413.

The through hole 43I extends in the z direction through the conductor part 41I of the wiring layer 411, the insulating part 41Y of the wiring layer 412 and the conductor part 41S of the wiring layer 413.

The through hole 43J extends in the z direction through the conductor part 41J of the wiring layer 411, the insulating part 41Y of the wiring layer 412 and the conductor part 41T of the wiring layer 413.

The through hole 43K extends in the z direction through the conductor part 41K of the wiring layer 411, the insulating part 41Y of the wiring layer 412 and the conductor part 41U of the wiring layer 413.

The through hole 43L extends in the z direction through the conductor part 41L of the wiring layer 411, the insulating part 41Y of the wiring layer 412 and the conductor part 41U of the wiring layer 413.

As shown in FIGS. 7 to 9, in plan view of the conductive substrate 4, the area of each of the through holes 43A and 43B is larger than the area of each of the through holes 43C and 43D. Also, in plan view, the area of each of the through holes 43C and 43D is larger than the area of each of the through holes 43E to 43L.

The insertion members 44A and 44B are made of a conductive material, which is Cu or a Cu alloy, for example. The insertion members 44A and 44B are conductive members each in the shape of a pillar. In the present embodiment, the insertion members 44A and 44B have a generally circular cross section taken perpendicular to the z direction. In short, each of the insertion members 44A and 44B is in the shape of a circular cylinder. Note, however, that the sectional shape is not limited to a generally circular shape and may be generally oval or polygonal. In plan view as shown in FIGS. 3 and 6, each of the insertion members 44A and 44B has a plurality of recesses in the peripheral edge. In plan view, the area of each insertion member 44A is smaller than the area of each of the metal components 31 and 32 and yet larger than the area of each of the through-hole vias 45A to 45H.

Each through hole 43C has an insertion member 44A inserted therein. The insertion member 44A is inserted through (fitted into) the through hole 43C by, for example, press fitting. The insertion members 44A electrically connect the conductor part 41C (the wiring layer 411), the conductor parts 41P (the wiring layer 412) and the conductor part 41R (the wiring layer 413).

As shown in FIG. 3, when each insertion member 44A is inserted through the corresponding through hole 43C, a plurality of out-of-contact spaces 493 are formed between the inner surface of the through hole 43C and the side surface of the insertion member 44A by the respective recesses. In the example shown in FIG. 3, each out-of-contact space 493 is in a tubular shape with a circular cross section perpendicular to the z direction. Each out-of-contact space 493 is filled with solder, for example. Similarly to the out-of-contact spaces 491 and 492, providing the out-of-contact spaces 493 filled with solder can increase the bonding strength between the conductive substrate 4 and the insertion members 44A and electrically connect the insertion members 44A and the wiring layers 411 to 413.

Each through hole 43D has an insertion member 44B inserted in. The insertion member 44B is inserted through (fitted into) the through hole 43D by, for example, press fitting. The insertion members 44B electrically connect the conductor part 41D (the wiring layer 411), the conductor part 41M (the wiring layer 412) and the conductor parts 41W (the wiring layer 413).

As shown in FIG. 3, when each insertion member 44B is inserted through the corresponding through hole 43D, a plurality of out-of-contact spaces 494 are formed between the inner surface of the through hole 43D and the side surface of the insertion member 44B by the respective recesses. In the example shown in FIG. 3, each out-of-contact space 494 is in a tubular shape with a circular cross section perpendicular to the z direction. Each out-of-contact space 494 is filled with solder, for example. Similarly to the out-of-contact spaces 491, 492 and 493, providing the out-of-contact spaces 494 filled with solder can increase the bonding strength between the conductive substrate 4 and the insertion members 44B and electrically connecting the insertion members 44B and the wiring layers 411 to 413.

The through-hole vias 45A to 45L are made of a conductive material, which is Cu or a Cu alloy, for example. In plan view, the area of each of the through-hole vias 45A to 45L is smaller than the area of each of the insertion members 44A and 44B.

Each through-hole via 45A fills a through hole 43E. Instead of filling a through hole 43E, a through-hole via 45A may be formed by a tubular member covering the inner surface of a through hole 43E. The through-hole vias 45A electrically connect the conductor parts 41E (the wiring layer 411) to the conductor part 41S (the wiring layer 413).

Each through-hole via 45B fills a through hole 43F. Instead of filling a through hole 43F, a through-hole via 45B may be formed by a tubular member covering the inner surface of the through hole 43F. The through-hole vias 45B electrically connect the conductor parts 41F (the wiring layer 411) to the conductor part 41T (the wiring layer 413).

Each through-hole via 45C fills a through hole 43G. Instead of filling a through hole 43G, a through-hole via 45C may be formed by a tubular member covering the inner surface of the through hole 43G. The through-hole vias 45C electrically connect the conductor parts 41G (the wiring layer 411) to the conductor part 41U (the wiring layer 413).

Each through-hole via 45D fills a through hole 43H. Instead of filling a through hole 43H, a through-hole via 45D may be formed by a tubular member covering the inner surface of the through hole 43H. The through-hole vias 45D electrically connect the conductor parts 41H (the wiring layer 411) to the conductor part 41V (the wiring layer 413).

The through-hole via 45E fills the through hole 43I. Instead of filling the through hole 43I, the through-hole via 45E may be formed by a tubular member covering the inner surface of the through hole 43I. The through-hole via 45E electrically connects the conductor part 41I (the wiring layer 411) to the conductor part 41S (the wiring layer 413).

The through-hole via 45F fills the through hole 43J. Instead of filling the through hole 43J, the through-hole via 45F may be formed by a tubular member covering the inner surface of the through hole 43J. The through-hole via 45F electrically connects the conductor part 41J (the wiring layer 411) to the conductor part 41T (the wiring layer 413).

The through-hole via 45G fills the through hole 43K. Instead of filling the through hole 43K, the through-hole via 45G may be formed by a tubular member covering the inner surface of the through hole 43K. The through-hole via 45G electrically connects the conductor part 41K (the wiring layer 411) to the conductor part 41U (the wiring layer 413).

The through-hole via 45H fills the through hole 43L. Instead of filling the through hole 43L, the through-hole via 45H may be formed by a tubular member covering the inner surface of the through hole 43L. The through-hole via 45H electrically connects the conductor part 41L (the wiring layer 411) to the conductor part 41V (the wiring layer 413).

As shown in FIGS. 2 and 3, the pair of signal terminals 51A and 51B are adjacent to the conductive substrate 4 in the y direction. The signal terminal 51A receives a drive signal for driving (turning on and off) the semiconductor elements 1. The signal terminal 51A receives a drive signal for driving (turning on and off) the semiconductor elements 2.

As shown in FIG. 3, each of the signal terminals 51A and 51B includes a pad section 511 and a terminal section 512. The pad sections 511 of the signal terminals 51A and 51B are covered by the resin package 7. The signal terminals 51A and 51B are thus supported by the resin package 7. The pad sections 511 may have a Ag plated surface. Each terminal section 512 is connected to the pad section 511 and exposed from the resin package 7. The terminal section 512 has an L shape as viewed in the x direction.

As shown in FIGS. 2 and 3, the sensing terminals 52A and 52B are respectively adjacent to the signal terminals 51A and 51B in the x direction. The sensing terminal 52A is used to detect voltage applied to the source electrodes 12 of the semiconductor elements 1 (voltage corresponding to the source current). The sensing terminal 52B is used to detect voltage applied to the source electrodes 22 of the semiconductor elements 2 (voltage corresponding to the source current).

As shown in FIG. 3, each of the sensing terminals 52A and 52B includes a pad section 521 and a terminal section 522. The pad sections 521 of the sensing terminals 52A and 52B are covered by the resin package 7. The sensing terminals 52A and 52B are thus supported by the resin package 7. The pad sections 521 may have a Ag plated surface. Each terminal section 522 is connected to the pad section 521 and exposed from the resin package 7. The terminal section 522 has an L shape as viewed in the x direction.

As shown in FIGS. 2 and 3, the dummy terminals 53 are located near the signal terminals 51A and 51B and the sensing terminals 52A and 52B in the x direction. In the present embodiment, six dummy terminals 53 are provided. As shown in FIGS. 1 to 5, the six dummy terminals 53 are located between the signal terminal 51A and the signal terminal 51B and thus between the sensing terminal 52A and the sensing terminal 52B. Three of the dummy terminals 53 are offset in one of the x directions (x2 direction) from the middle of the resin package 7 in the x direction. The other three dummy terminals 53 are offset in the other x direction (x1 direction) from the middle of the resin package 7 in the x direction. Note that the number and arrangement of the dummy terminals 53 are not limited to this example. In an alternative example, the dummy terminals 53 may be omitted.

As shown in FIG. 3, each dummy terminal 53 includes a pad section 531 and a terminal section 532. The pad sections 531 of the dummy terminals 53 are covered by the resin package 7. The dummy terminals 53 are thus supported by the resin package 7. The pad sections 531 may have a Ag plated surface. Each terminal section 532 is connected to the pad section 531 and exposed from the resin package 7. The terminal section 532 has an L shape as viewed in the x direction. The shape of the terminal sections 532 is identical to the shape of the terminal sections 512 of the pair of signal terminals 51A and 51B and also to the shape of the terminal sections 522 of the pair of sensing terminals 52A and 52B.

The connecting members 6A to 6J each connect two components spaced apart from each other. The connecting members 6A to 6J are bonding wires. The connecting members 6A to 6J may be made of any metal containing Cu, Au or Al, for example. Alternatively to the bonding wires, the connecting members 6A to 6J may be bonding ribbons or lead plates, depending on the specifications of the semiconductor device A1.

As shown in FIG. 3, each connecting member 6A connects the source electrode 12 of a semiconductor element 1 to the conductor part 41C to provide electrical communication therebetween. Each connecting member 6B connects the source electrode 22 of a semiconductor element 2 to the conductor part 41D and provides electrical communication therebetween. Each connecting member 6C connects the gate electrode 13 of a semiconductor element 1 to a conductor part 41E and provides electrical communication therebetween. Each connecting member 6D connects the gate electrode 23 of a semiconductor element 2 to a conductor part 41G and provides electrical communication therebetween. Each connecting member 6E connects the source electrode 12 of a semiconductor element to a conductor part 41F and provides electrical communication therebetween. Each connecting member 6F connects the source electrode 22 of a semiconductor element to a conductor part 41H and provides electrical communication therebetween.

As shown in FIG. 3, the connecting member 6G connects the pad section 511 of the signal terminal 51A to the conductor part 41I and provides electrical communication therebetween. The connecting member 6H connects the pad section 521 of the sensing terminal 52A to the conductor part 41J and provides electrical communication therebetween. The connecting member 6I connects the pad section 511 of the signal terminal 51B to the conductor part 41K and provides electrical communication therebetween. The connecting member 6J connects the pad section 521 of the sensing terminal 52B to the conductor part 41L and provides electrical communication therebetween.

The electrodes of each of the semiconductor elements 1 and 2 (the drain electrodes 11 and 21, the source electrodes 12 and 22 and the gate electrodes 13 and 23) are electrically connected to the external terminals of the semiconductor device A1 (the power terminal sections 401, 402 and 403, the signal terminals 51A and 51B, and the sensing terminals 52A and 52B) by the following components.

The power terminal section 401 is electrically connected to the drain electrodes 11 of the semiconductor elements 1 via the conductor part 41A and the metal components 31. The power terminal section 402 is electrically connected to the source electrodes 22 of the semiconductor elements 2 via the conductor part 41M, the insertion members 44B, the conductor part 41D and the connecting members 6B. The power terminal section 403 is electrically connected to the source electrodes 12 of the semiconductor elements 1 via the conductor part 41B, the metal components 32, the conductor part 41R, the insertion members 44A, the conductor parts 41C and the connecting members 6A, and also to the drain electrodes 21 of the semiconductor elements 2 via the conductor part 41B and the metal components 32.

The signal terminal 51A is electrically connected to the gate electrodes 13 of the semiconductor elements 1 via the connecting member 6G, the conductor part 41I, the through-hole via 45E, the conductor part 41S, the through-hole vias 45A, the conductor parts 41E and the connecting members 6C. The sensing terminal 52A is electrically connected to the source electrodes 12 of the semiconductor elements 1 via the connecting member 6H, the conductor part 41J, the through-hole via 45F, the conductor part 41T, the through-hole vias 45B, the conductor parts 41F and the connecting members 6E. The signal terminal 51B is electrically connected to the gate electrodes 23 of the semiconductor elements 2 via the connecting member 6I, the conductor part 41K, the through-hole via 45G, the conductor part 41U, the through-hole vias 45C, the conductor parts 41G and the connecting members 6D. The sensing terminal 52B is electrically connected to the source electrodes 22 of the semiconductor elements 2 via the connecting member 6J, the conductor part 41L, the through-hole via 45H, the conductor part 41V, the through-hole vias 45D, the conductor parts 41H and the connecting members 6F.

As shown in FIGS. 3 to 5, the resin package 7 covers the semiconductor elements 1 and 2, the metal components 31 and 32, a part of the insulating substrate 33, a part of the conductive substrate 4, a part of each of the signal terminals 51A and 51B, a part of each of the sensing terminals 52A and 52B, a part of each of the dummy terminals 53, and the connecting members 6A to 6J. The resin package 7 may be made of, for example, an epoxy resin, which is an insulating material. The shape of the resin package 7 is not limited to the example shown in FIGS. 1 and 3 to 5 and may be modified depending on the specifications of the semiconductor device A1. As shown in FIGS. 3 to 5, the resin package 7 has a resin obverse surface 71, a resin reverse surface 72 and a plurality of resin side surfaces 731 to 734.

As shown in FIG. 5, the resin obverse surface 71 and the resin reverse surface 72 are spaced apart from each other in the z direction, with the resin obverse surface 71 facing in the z2 direction and the resin reverse surface 72 in the z1 direction. As shown in FIG. 4, the resin reverse surface 72 has the shape of a frame enclosing the substrate reverse surface 33b of the insulating substrate 33. The substrate reverse surface 33b of the insulating substrate 33 is exposed from the resin reverse surface 72. Each of the resin side surfaces 731 to 734 is located between the resin obverse surface 71 and the resin reverse surface 72 in the z direction and connected to both the surfaces. The resin side surfaces 731 and 732 are spaced apart from each other in the x direction, with the resin side surface 731 facing in the x1 direction, and the resin side surface 732 in the x2 direction. The resin side surfaces 733 and 734 are spaced apart from each other in the x direction, with the resin side surface 733 facing in the y1 direction, and the resin side surface 734 in the y2 direction. In the present embodiment, the signal terminals 51A and 51B, the sensing terminals 52A and 52B and the dummy terminals 53 protrude from the resin side surface 734.

As shown in FIGS. 1, 4 and 5, the resin package 7 has a plurality of recesses 75 each of which is recessed from the resin reverse surface 72 in the z direction. Note, however, that the resin package 7 may be without the recesses 75. Each recess 75 extends in the y direction across the resin reverse surface 72, from the y1-direction edge to the y2-direction edge. In one example, the recesses 75 may be arranged along each side of the substrate reverse surface 33b of the insulating substrate 33 in plan view, such that three recesses are located on one side and the other three on the other side in the x direction.

The semiconductor device A1 achieves the following advantages.

The semiconductor device A1 includes the conductive substrate 4 formed by laminating the wiring layer 411, the wiring layer 412 and the insulating layer 421. The wiring layer 411 includes the power terminal section 401, and the wiring layer 412 includes the power terminal section 402. The power terminal section 401, the power terminal section 402 and the insulating layer 421 overlap with each other in plan view. With this configuration, the power terminal section 401 and the power terminal section 402 at which source voltage may be applied are provided in a laminated wiring structure, so that the inductance of wiring between the power terminal section 401 and the power terminal section 402 can be reduced. This is effective to reduce the inductance of the semiconductor device A1.

The semiconductor device A1 includes the metal components 31 extending in the z direction through the conductive substrate 4. The semiconductor elements 1 are mounted on the metal components 31. This configuration ensures that heat from the semiconductor elements 1 during operation of the semiconductor device A1 is effectively dissipated. Consequently, the semiconductor device A1 ensures that the increase of the junction temperature of the semiconductor elements 1 is reduced, thereby protecting the semiconductor elements 1 from thermal destruction. The semiconductor device A1 also includes the metal components 32 extending in the z direction through the conductive substrate 4. The semiconductor elements 2 are mounted on the metal components 32. This configuration ensures that heat from the semiconductor elements 2 during operation of the semiconductor device A1 is effectively dissipated. Consequently, the semiconductor device A1 ensures that the increase of the junction temperature of the semiconductor elements 2 is reduced, thereby protecting the semiconductor elements 2 from thermal destruction.

The semiconductor device A1 includes the insertion members 44A and 44B each having a larger area than the through-hole vias 45A to 45H in plan view. This configuration ensures that the insertion members 44A and 44B have a lower parasitic resistance or parasitic inductance than the through-hole vias 45A to 45H. The insertion members 44A and 44B form a part of the current path for power conversion by the semiconductor device A1, and the through-hole vias 45A to 45H form a part of the signal path for power conversion by the semiconductor device A1. It means that the insertion members 44A and 44B pass a relatively high current. Reducing the parasitic resistance and inductance of the insertion members 44A and 44B is therefore effective to reduce conduction loss. The current paths mentioned above may pass a current ranging from 400 to 600 amperes, for example.

The semiconductor device A1 includes the metal components 31 and 32 each having a larger area than each of the insertion members 44A and 44B in plan view. This configuration ensures the thermal conductivity of the metal components 31 and 32 to be higher than the thermal conductivity of the insertion members 44A and 44B. The semiconductor device A1 is therefore enabled to improve the thermal conductivity of the metal components 31 and 32 without compromising appropriate conductivity.

According to the first embodiment, the wiring layer 413 has the conductor part 41Q. This conductor part 41Q, however, may be omitted. The conductor part 41Q is not a part of the current path for electric conversion by the semiconductor device A1, and the absence of the conductor part 41Q does not directly affect the electric conversion of the semiconductor device A1. Yet, heat generated in the semiconductor device A1 (mainly by the semiconductor elements 1 and 2) will increase the temperature of the conductive substrate 4. Without the conductor part 41Q, the ratio between the conductor area and the insulating area differs greatly between the opposite parts of the wiring layer 413 in the x direction. Due to this difference, in addition to the difference in thermal expansion coefficient between the conductor parts and the insulating parts (including the insulating layer) within the wiring layer 413, warpage of the wiring layer 413 may be caused. Providing the conductor part 41Q to the wiring layer 413 is effective to prevent such warpage of the wiring layer 413, because the opposite parts of the wiring layer 413 in the x direction will have a smaller difference in ratio between the conductor area and the insulating area.

FIGS. 10 to 17 shows a semiconductor device B1 according to a second embodiment. The semiconductor device B1 includes a plurality of semiconductor elements 1, a plurality of semiconductor elements 2, two metal components 81 and 82, insulating substrates 33, a conductive substrate 4, a pair of signal terminals 51A and 51B, a pair of sensing terminals 52A and 52B, a plurality of dummy terminals 53, a plurality of connecting members 6A to 6J, and a resin package 7. The semiconductor B1 differs from the semiconductor device A1 in having the metal component 81 and the metal component 82 instead of the metal components 31 and the metal components 32, and also differs in the structure of the conductive substrate 4.

Figure 10:
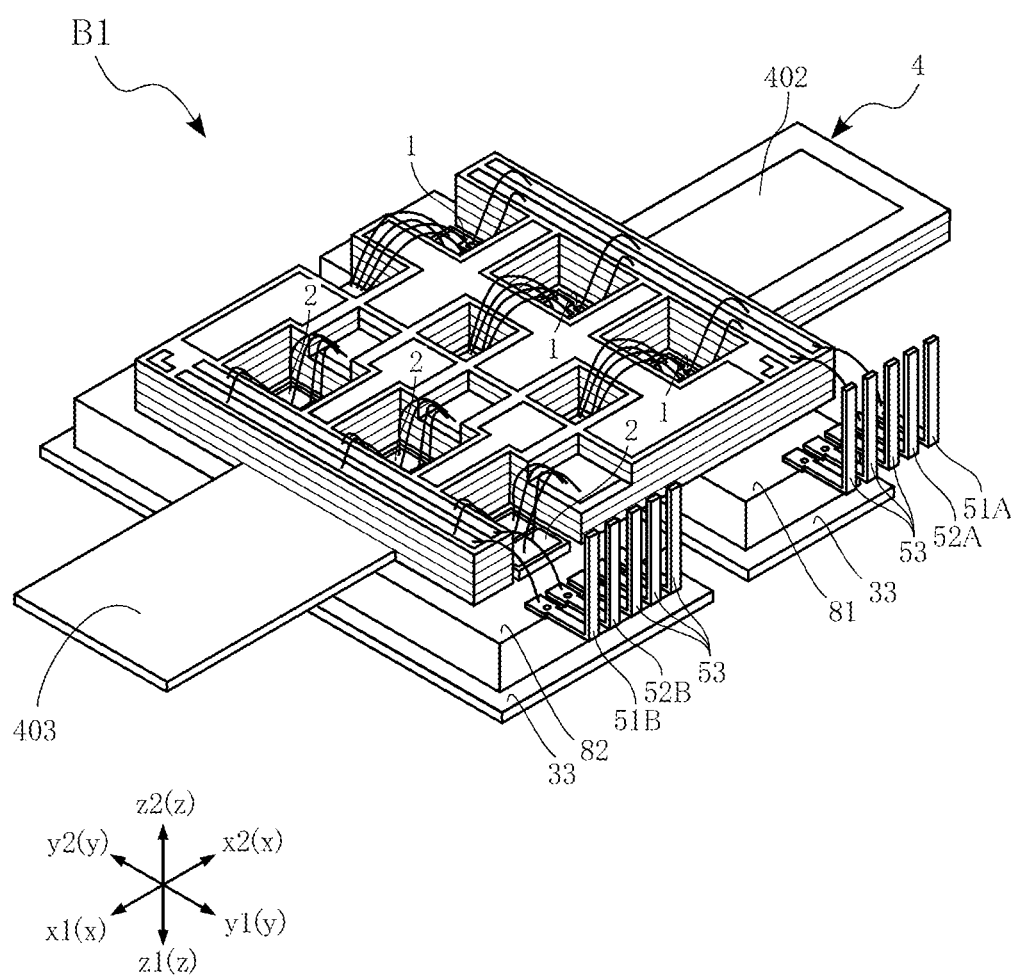
FIG. 10 is a perspective view of a semiconductor device according to a second embodiment, omitting a resin package.
Figure 11:
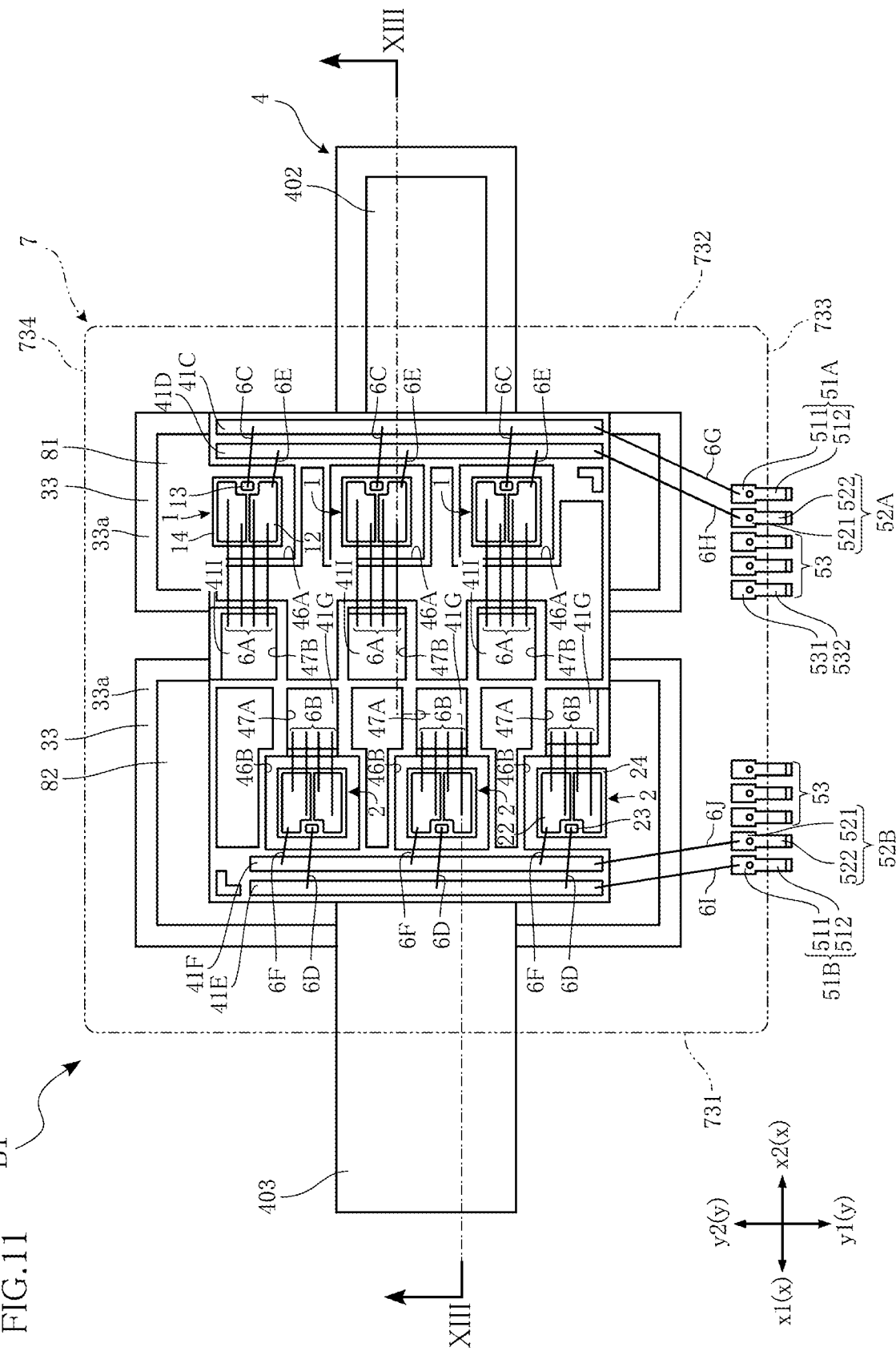
FIG. 11 is a plan view of the semiconductor device according to the second embodiment.
Figure 12:
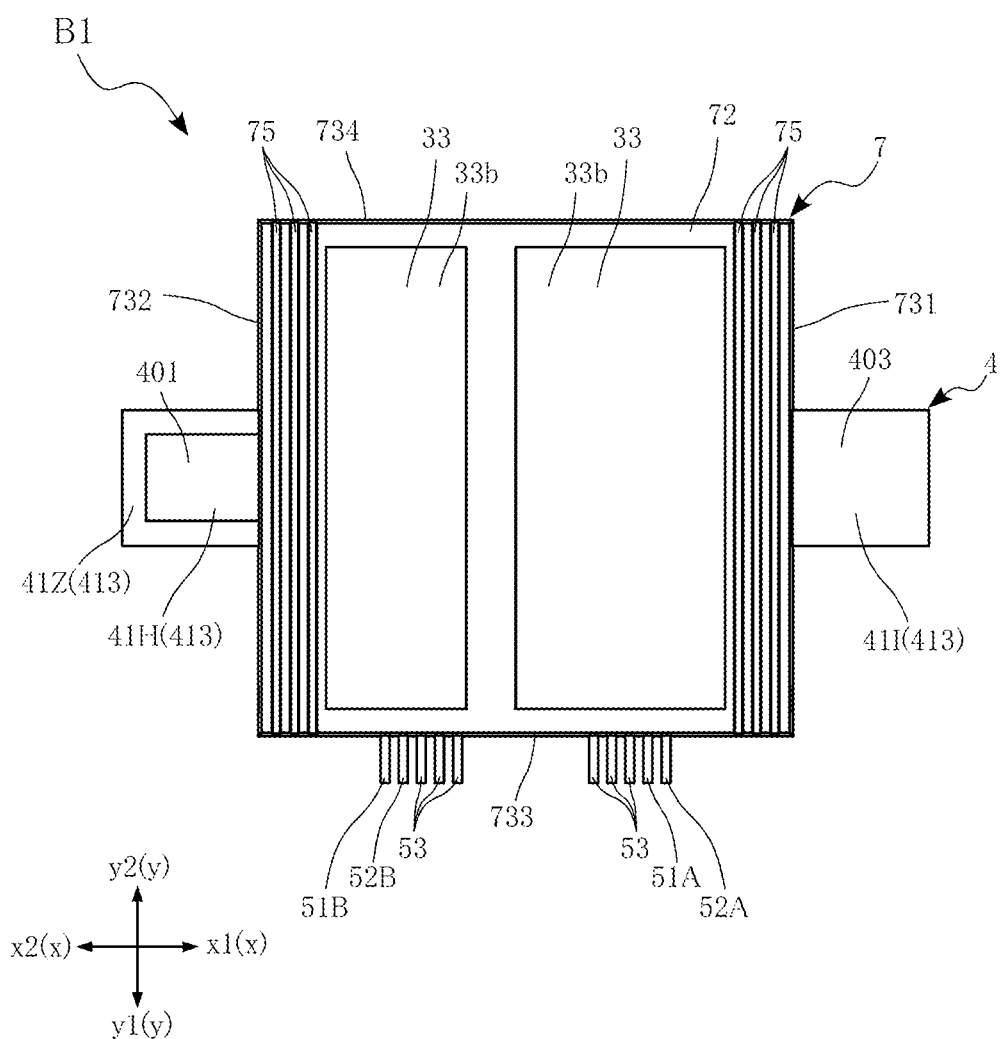
FIG. 12 is a bottom view of the semiconductor device according to the second embodiment.
Figure 13:
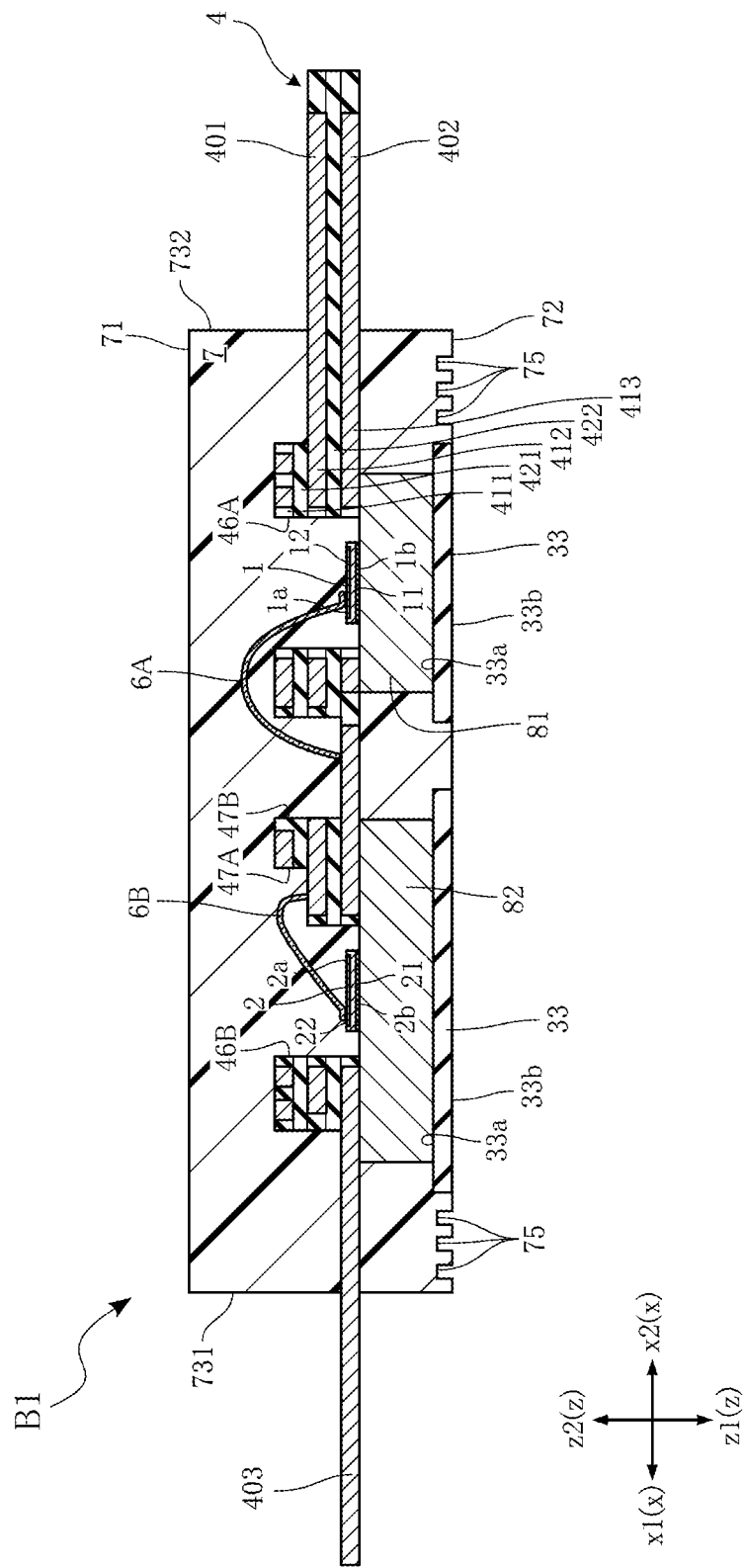
FIG. 13 is a sectional view along line XIII-XIII of FIG. 11.

FIG. 10 is a perspective view of the semiconductor device B1, omitting the resin package 7. FIG. 11 is a plan view of the semiconductor device B1, with the resin package 7 indicated by phantom lines (dash-dotted lines). FIG. 12 is a bottom view of the semiconductor device B1. FIG. 13 is a sectional view along line XIII-XIII of FIG. 11. FIGS. 14 to 17 show the detailed structure of the conductive substrate 4.

Each of the two metal components 81 and 82 is a conductive member in the shape of a rectangular parallelepiped. The two metal components 81 and 82 are spaced apart from each other. In the present embodiment, the two metal components 81 and 82, though mutually spaced apart, overlap with each other as viewed in the x direction. The metal components 81 and 82 may be made of Cu or an alloy of Cu, for example.

The semiconductor elements 1 are mounted on the metal component 81, so that the respective drain electrodes 11 of the semiconductor elements 1 are electrically connected to the metal component 81. The metal component 81 and the conductive substrate 4 together form an internal circuit of the semiconductor device B1. In the present embodiment, the metal component 81 may correspond to a first metal component recited in the claims.

The semiconductor elements 2 are mounted on the metal component 82, so that the respective drain electrodes 21 of the semiconductor elements 2 are electrically connected to the metal component 82. The metal component 82 and the conductive substrate 4 together form an internal circuit of the semiconductor device B1. In the present embodiment, the metal component 82 may correspond to a second metal component recited in the claims.

The semiconductor device B1 includes two insulating substrates 33 spaced apart from each other. The metal component 81 is mounted on one of the two insulating substrates 33, and the metal component 82 on the other of the insulating substrates 33. The number of the insulating substrates 33 is not limited to two. For example, only one insulating substrate 33 may be provided, and the two metal components 81 and 82 may be mounted on the insulating substrate 33.

The conductive substrate 4 extends across the two metal components 81 and 82 and bonded and electrically connected to the metal components 81 and 82 by a conductive bonding material (not illustrated). The conductive substrate 4 is arranged to surround the semiconductor elements 1, 2 in plan view and disposed between the metal components 31 and 32 in plan view. As shown in FIG. 13, the conductive substrate 4 as viewed in the x direction overlaps with the semiconductor elements 1 and 2 but does not overlap with the metal components 81 and 82. Additionally, as viewed in the y direction, the conductive substrate 4 overlaps with the semiconductor elements 1 and 2 but does not overlap with the metal components 31 and 32.

The conductive substrate 4 is a laminate composed of three wiring layers 411, 412 and 413 and two insulating layers 421 and 422 laminated in the z direction. The three wiring layers 411, 412 and 413 and the two insulating layers 421 and 422 are laminated in the same order as in the conductive substrate 4 of the semiconductor device A1.

Figure 14:
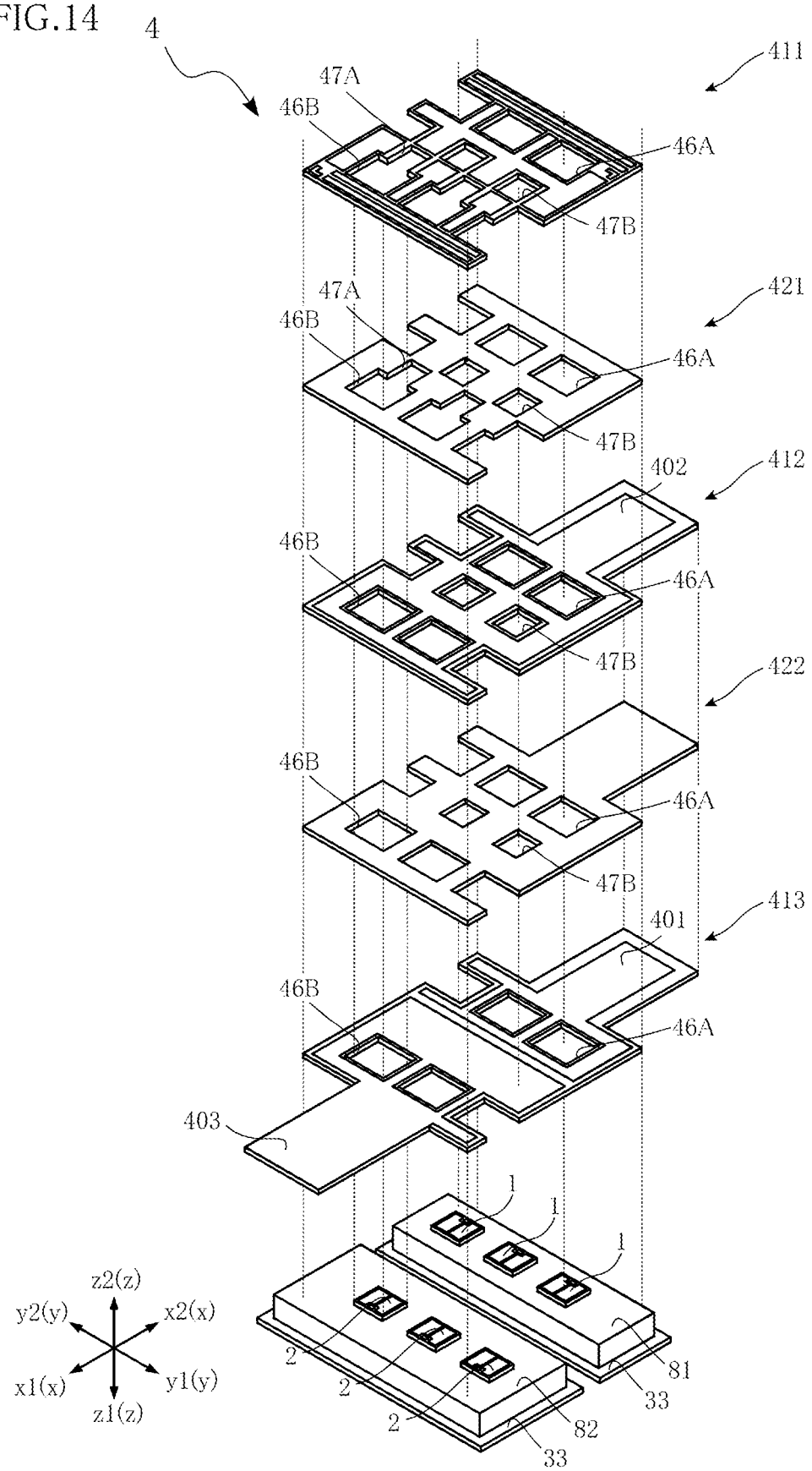
FIG. 14 is an exploded perspective view of a conductive substrate according to the second embodiment.
Figure 15:
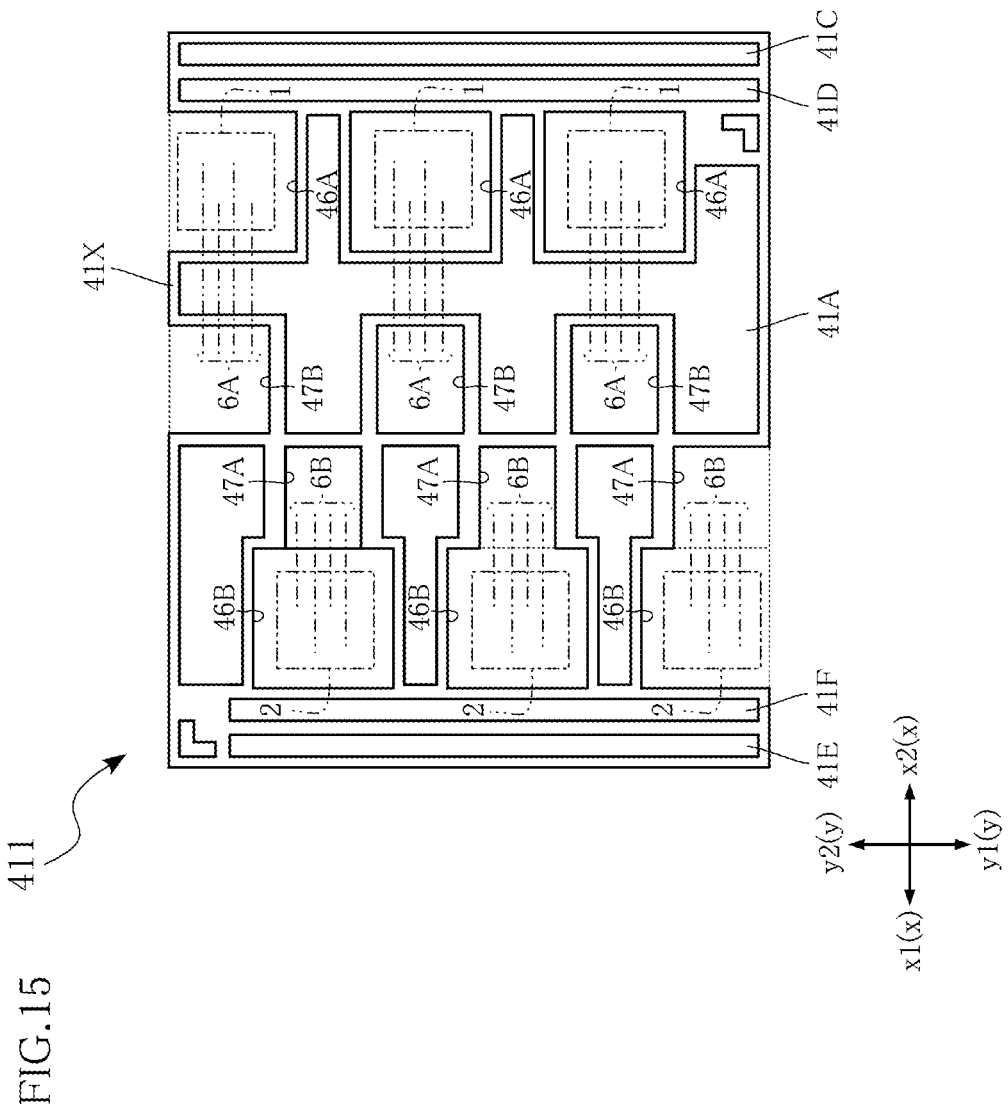
FIG. 15 is a plan view showing one of a plurality of wiring layers of the conductive substrate according to the second embodiment.
Figure 16:
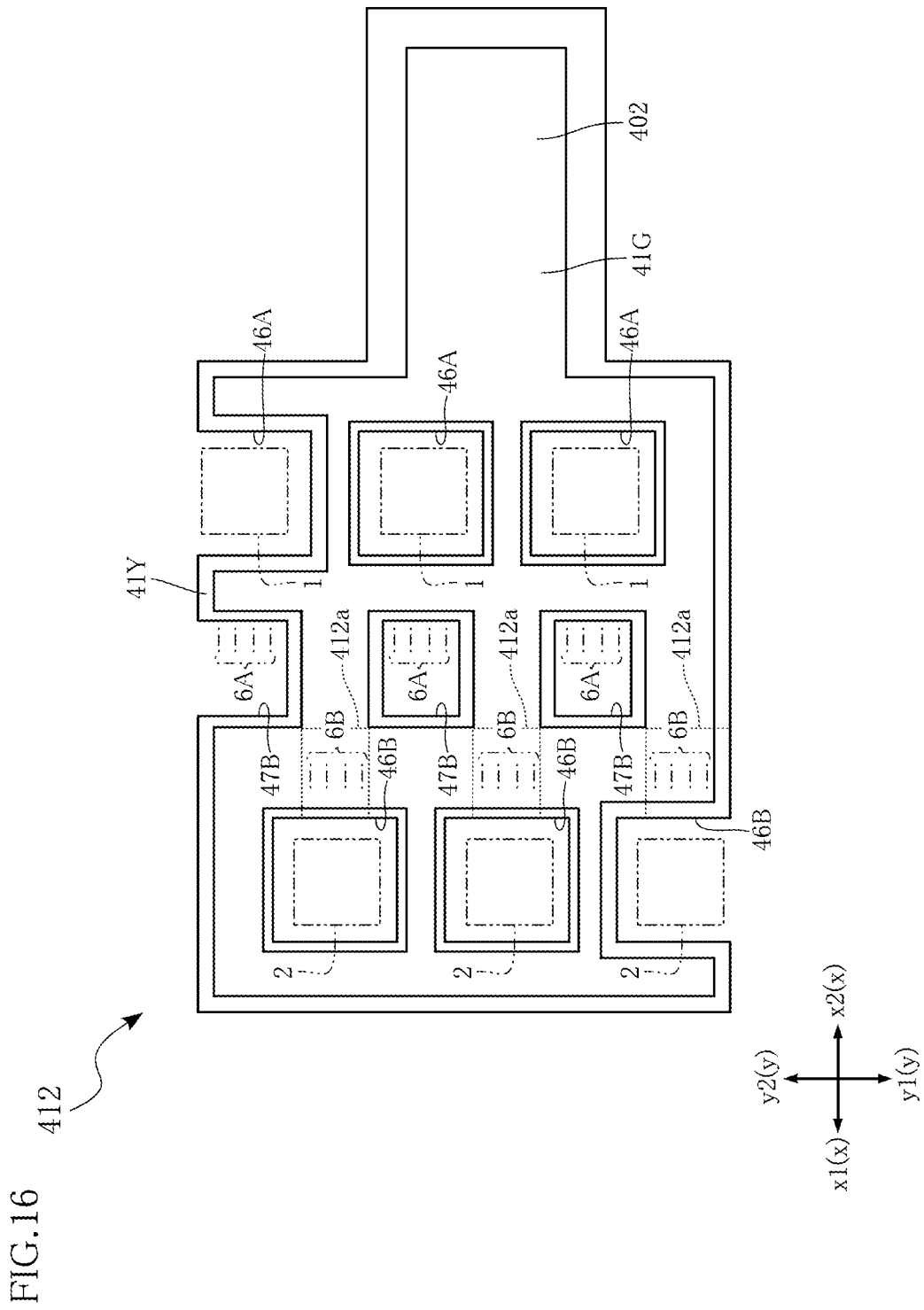
FIG. 16 is a plan view showing one of the wiring layers of the conductive substrate according to the second embodiment.
Figure 17:
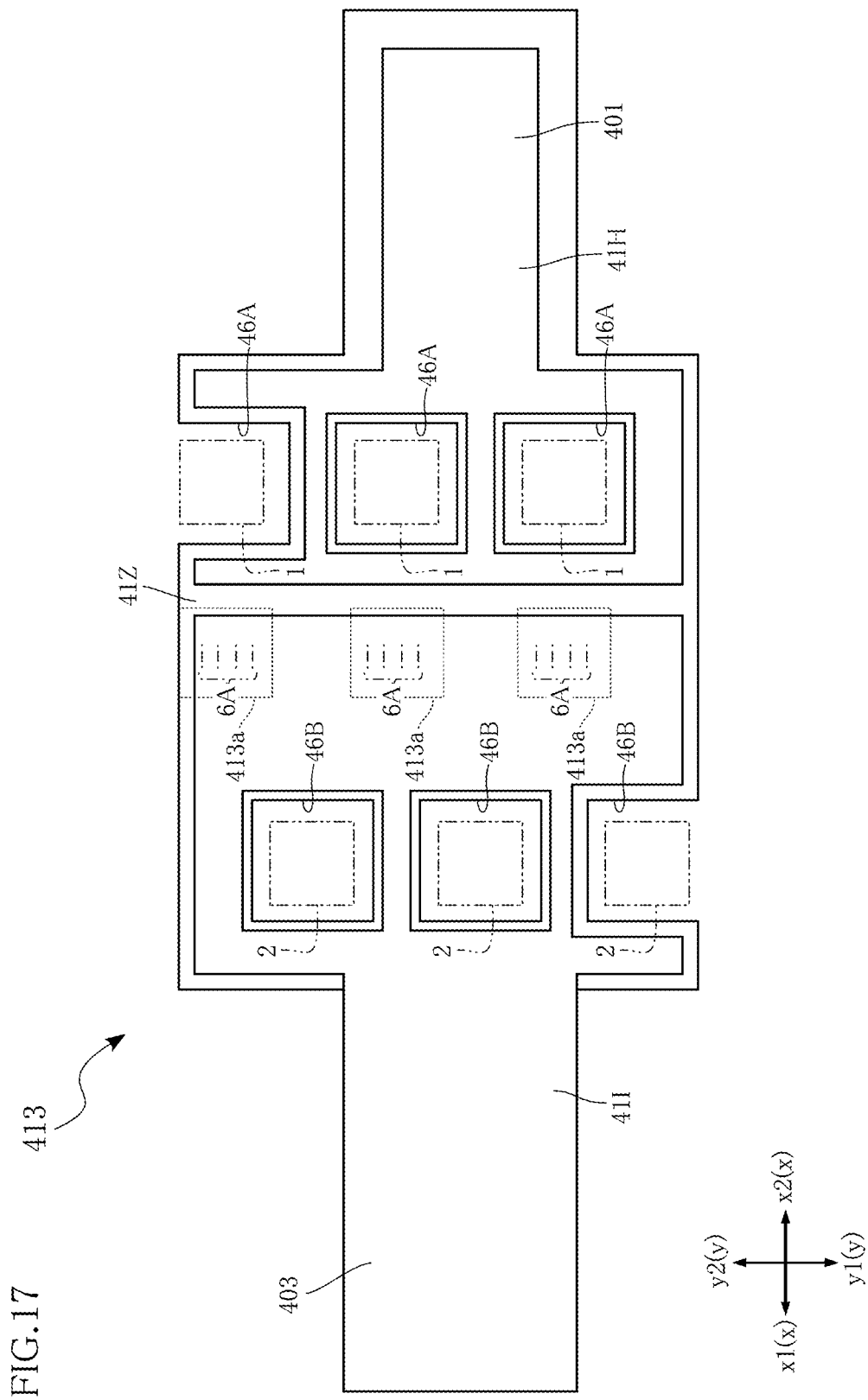
FIG. 17 is a plan view showing one of the wiring layers of the conductive substrate according to the second embodiment.

The conductive substrate 4 according to the present embodiment may have a laminated structured as shown in FIGS. 14 to 17. FIG. 14 is an exploded perspective view of the conductive substrate 4. FIG. 14 also shows the semiconductor elements 1 and 2 and the two metal components 81 and 82 for convenience. FIG. 15 is a plan view of the wiring layer 411. FIG. 16 is a plan view of the wiring layer 412. FIG. 17 is a plan view of the wiring layer 413.

According to the present embodiment, the wiring layer 411 includes a plurality of conductor parts 41A to 41F and an insulating part 41X as shown in FIG. 15. The conductor parts 41A to 41F are spaced apart from each other and insulated by the insulating part 41X. As shown in FIG. 16, the wiring layer 412 includes a conductor part 41G and an insulating part 41Y. The insulating part 41Y covers the edges of the conductor part 41G in plan view. As shown in FIG. 17, the wiring layer 413 includes two conductor parts 41H and 41I and an insulating part 41Z. The two conductor parts 41H and 41I are spaced apart from each other and insulated by the insulating part 41Z. The conductor part 41H is electrically connected to the metal component 81 and the conductor part 41I to the metal component 82.

According to the present embodiment, the power terminal section 401 is a part of the conductor part 41H (the wiring layer 413) as shown in FIG. 17. The power terminal section 402 is a portion of the conductor part 41G (the wiring layer 412) as shown in FIG. 16. The power terminal section 403 is a portion of the conductor part 41I as shown in FIG. 17. Similarly to the semiconductor device A1, the semiconductor device B1 is configured such that the two power terminal sections 401 and 402 overlap with each other in plan view.

As shown in FIGS. 13 and 14, the insulating layer 422 is interposed between the power terminal section 401 and the power terminal section 402 in the z direction. The power terminal section 401 is exposed to the outside of the semiconductor device A2 at the surface facing in the z2 direction, and in contact with the insulating layer 422 at the surface facing in the 1 direction. The power terminal section 402 is in contact with the insulating layer 422 at surface facing in the z2 direction, and exposed to the outside of the semiconductor device B1 at the surface facing in the z1 direction.

In the present embodiment, the wiring layer 411 may correspond to a third wiring layer recited in the claims, and the wiring layer 412 to a second wiring layer, and the wiring layer 413 to a first wiring layer. In addition, the insulating layer 421 may correspond to a second insulating layer recited in the claims, and the insulating layer 422 to a first insulating layer.

The conductive substrate 4 has a plurality of through holes 46A and 46B and a plurality of recesses 47A and 47B.

Each of the through holes 46A and 46B extends through the conductive substrate 4 in the z direction. In other words, the through holes 46A to 46B extend in the z direction through the wiring layers 411, 412 and 413 and the insulating layers 421 and 422. The metal component 81 is exposed in each through hole 46A, and the metal component 82 is exposed in each through hole 46B. Each through hole 46A a semiconductor element 1 therein, and each through hole 46B accommodates a semiconductor element 2 therein. In plan view, each through hole 46A is larger than the corresponding semiconductor element 1 and overlaps with the entire semiconductor element 1. In plan view each through hole 46B is larger than the corresponding semiconductor element 2 and overlaps with the entire semiconductor element 2. In the present embodiment, the through hole 46A may correspond to a first through hole recited in the claims, and the through hole 46B to a second through hole.

Each of the recesses 47A and 47B formed in the conductive substrate 4 is recessed in the z direction from the surface facing in the z2 direction. Each recess 47A extends in the z direction through the wiring layer 411 and the insulating layer 421, and terminates without extending through the wiring layers 412 and 413 and the insulating layer 422. The conductor part 41G (the wiring layer 412) is exposed through the recesses 47A. That is, the wiring layer 412 has portions 412a exposed through the recesses 47A as shown in FIG. 16. In the example shown in FIGS. 14 and 15, in the wiring layer 411 and the insulating layer 421, each recess 47A is connected to a through hole 46A. Each recess 47B extends in the z direction through the wiring layer 411, the insulating layer 421, the wiring layer 412 and the insulating layer 422, and terminates without extending through the wiring layer 413. The conductor part 41I (the wiring layer 413) is exposed through the recesses 47B. That is, the wiring layer 413 has portions 413a exposed through the recesses 47B, as shown in FIG. 17. According to the present embodiment, the recess 47A may correspond to a first recess recited in the claims, and the recess 47B to a second recess. In addition, the exposed part 412a may correspond to a first exposed part recited in the claims, and an exposed part 413a to a second exposed part.

According to the present embodiment, the connecting members 6A to 6J are connected as shown in FIG. 11 and as described below.

Each connecting member 6A connects the source electrode 12 of a semiconductor element 1 to the conductor part 41I and provides electrical communication therebetween. Each connecting member 6A passes through a corresponding recess 47B and bonded to the exposed part 413a of the wiring layer 413 (the conductor part 41I). Each connecting member 6B connects the source electrode 22 of a semiconductor element to the conductor part 41G and provides electrical communication therebetween. Each connecting member 6B passes through a corresponding recess 47A and bonded to the exposed part 412a of the wiring layer 412 (the conductor part 41G). According to the present embodiment, a connecting member 6A may correspond to a first connecting member recited in the claims, and a connecting member 6B to a second connecting member.

Each connecting member 6C connects the gate electrode 13 of a semiconductor element 1 to the conductor part 41C and provides electrical communication therebetween. Each connecting member 6D connects the gate electrode 23 of a semiconductor element 2 to the conductor part 41E and provides electrical communication therebetween. Each connecting member 6E connects the source electrode 12 of a semiconductor element 1 to the conductor part 41D and provides electrical communication therebetween. Each connecting member 6F connects the source electrode 22 of a semiconductor element 2 to the conductor part 41F and provides electrical communication therebetween.

The connecting member 6G connects the pad section 511 of the signal terminal 51A to the conductor part 41C and provides electrical communication therebetween. The connecting member 6H connects the pad section 521 of the sensing terminal 52A to the conductor part 41D and provides electrical communication therebetween. The connecting member 6I connects the pad section 511 of the signal terminal 51B to the conductor part 41E and provides electrical communication therebetween. The connecting member 6J connects the pad section 521 of the sensing terminal 52B to the conductor part 41F and provides electrical communication therebetween.

The electrodes of each of the semiconductor elements 1 and 2 (the drain electrodes 11 and 21, the source electrodes 12 and 22 and the gate electrodes 13 and 23) are electrically connected to the external terminals of the semiconductor device B1 (the power terminal sections 401, 402 and 403, the signal terminals 51A and 51B, and the sensing terminals 52A and 52B) by the following components.

The power terminal section 401 is electrically connected to the drain electrodes 11 of the semiconductor elements 1 via the conductor part 41H and the metal component 81. The power terminal section 402 is electrically connected to the source electrodes 22 of the semiconductor elements 2 via the conductor part 41G and the connecting members 6B. The power terminal section 403 is electrically connected to the source electrodes 12 of the semiconductor elements 1 via the conductor part 41I and the connecting members 6A, and also to the drain electrodes 21 of the semiconductor elements 2 via the conductor part 41I and the metal component 82.

The signal terminal 51A is electrically connected to the gate electrodes 13 of the semiconductor elements 1 via the connecting member 6G, the conductor part 41C and the connecting members 6C. The sensing terminal 52A is electrically connected to the source electrodes 12 of the semiconductor elements 1 via the connecting member 6H, the conductor part 41D and the connecting members 6E. The signal terminal 51B is electrically connected to the gate electrodes 23 of the semiconductor elements 2 via the connecting member 6I, the conductor part 41E and the connecting members 6D. The sensing terminal 52B is electrically connected to the source electrodes 22 of the semiconductor elements 2 via the connecting member 6J, the conductor part 41F and the connecting members 6F.

In the present embodiment, the signal terminals 51A and 51B, the sensing terminals 52A and 52B and the dummy terminals 53 protrude from the resin side surface 733.

The semiconductor device B1 achieves the following advantages and effects.

The semiconductor device B1 includes the conductive substrate 4 formed by laminating the wiring layer 412, the wiring layer 413 and the insulating layer 422. The wiring layer 413 includes the power terminal section 401, and the wiring layer 412 includes the power terminal section 402. The power terminal section 401, the power terminal section 402 and the insulating layer 422 overlap with each other in plan view. With this configuration, the power terminal section 401 and the power terminal section 402 at which source voltage may be applied are provided in a laminated wiring structure, so that the inductance of wiring between the power terminal section 401 and the power terminal section 402 can be reduced. This is effective to reduce the inductance of the semiconductor device B1.

The semiconductor device B1 includes the metal component 81 on which the semiconductor elements 1 are mounted. This configuration ensures that heat from the semiconductor elements 1 during operation of the semiconductor device B1 is effectively dissipated. Consequently, the semiconductor device B1 ensures that the increase of the junction temperature of the semiconductor elements 1 is reduced, thereby protecting the semiconductor elements 1 from thermal destruction. In particular, since the metal component 81 has a greater volume than the metal component 31, the semiconductor device B1 can more effectively dissipate heat from the semiconductor elements 1 than the semiconductor device A1. Also, the semiconductor device B1 includes the metal component 32 on which the semiconductor elements 2 are mounted. This configuration ensures that heat from the semiconductor elements 2 during operation of the semiconductor device B2 is effectively dissipated. Consequently, the semiconductor device B1 ensures that the increase of the junction temperature of the semiconductor elements 2 is reduced, thereby protecting the semiconductor elements 2 from thermal destruction. In particular, since the metal component 82 has a greater volume than the metal component 32, the semiconductor device B1 can more effectively dissipate heat from the semiconductor elements 2 than the semiconductor device A1.

The semiconductor devices according to the present disclosure is not limited to the specific embodiments described above. Various modifications can be made to the details of one or more parts of the semiconductor devices according to the present disclosure.

The semiconductor devices according to the present disclosure cover the embodiments according to the following clauses.

Clause 1.

A semiconductor device comprising:

a first semiconductor element including a first electrode, a second electrode and a third electrode, and controlled to turn on and off a connection between the first electrode and the second electrode by a first driving signal inputted to the third electrode;

a second semiconductor element including a fourth electrode, a fifth electrode and a sixth electrode, and controlled to turn on and off a connection between the fourth electrode and the fifth electrode by a second driving signal inputted to the sixth electrode;

a first metal component on which the first semiconductor element is mounted;

a second metal component on which the second semiconductor element is mounted, the second metal component being spaced apart from the first metal component; and a conductive substrate including a first wiring layer, a second wiring layer and a first insulating layer laminated such that the first insulating layer is interposed between the first wiring layer and the second wiring layer,
wherein the first wiring layer includes a first power terminal section electrically connected to the first electrode,
the second wiring layer includes a second power terminal section electrically connected to the fifth electrode,
the first power terminal section, the second power terminal section and the first insulating layer overlap with each other as viewed in a first direction that is a thickness direction of the conductive substrate, and
the conductive substrate surrounds the first semiconductor element and the second semiconductor element as viewed in the first direction and overlaps with a portion between the first metal component and the second metal component as viewed in the first direction.

Clause 2.
The semiconductor device according to Clause 1, wherein the conductive substrate further includes a third power terminal section electrically connected to the second electrode and the fourth electrode, and
the third power terminal section is spaced apart from the first power terminal section and the second power terminal section as viewed in the first direction.

Clause 3.
The semiconductor device according to Clause 2, comprising a resin package covering the first semiconductor element and the second semiconductor element,
wherein as viewed in the first direction, the first power terminal section and the second power terminal section are located opposite from the third power terminal section with the resin package intervening therebetween.

Clause 4.
The semiconductor device according to Clause 2 or 3, wherein the first wiring layer includes the third power terminal section.

Clause 5.
The semiconductor device according to any one of Clauses 1 to 4, wherein the conductive substrate has a first through hole and a second through hole each extending through the conductive substrate in the first direction,
the first metal component is inserted through the first through hole, and
the second metal component is inserted through the second through hole.

Clause 6.
The semiconductor device according to Clause 5, wherein as viewed in a second direction perpendicular to the first direction, the conductive substrate does not overlap with the first semiconductor element, the second semiconductor element, the first metal component and the second metal component.

Clause 7.
The semiconductor device according to Clause 5 or 6, wherein the conductive substrate further includes a third wiring layer and a second insulating layer, and
the second wiring layer and the third wiring layer are laminated with the second insulating layer therebetween.

Clause 8.
The semiconductor device according to Clause 7, wherein the conductive substrate further includes an insertion member electrically connecting at least two of the first wiring layer, the second wiring layer and the third wiring layer.

Clause 9.
The semiconductor device according to Clause 8, wherein the insertion member extends through the conductive substrate in the first direction.

Clause 10.
The semiconductor device according to Clause 8 or 9, wherein the conductive substrate further includes a through-hole via electrically connecting at least two of the first wiring layer, the second wiring layer and the third wiring layer.

Clause 11.
The semiconductor device according to Clause 10, wherein the through-hole via extends through the conductive substrate in the first direction.

Clause 12.
The semiconductor device according to Clause 10 or 11, wherein the insertion member is larger in area than the through-hole via as viewed in the first direction.

Clause 13.
The semiconductor device according to any one of Clauses 8 to 12, wherein each of the first metal component and the second metal component is larger in area than the insertion member as viewed in the first direction.

Clause 14.
The semiconductor device according to any one of Clauses 1 to 4, wherein the conductive substrate has a first through hole and a second through hole each extending through the conductive substrate in the first direction,
the first semiconductor element is contained in the first through hole as viewed in the first direction, and
the second semiconductor element is contained in the second through hole as viewed in the first direction.

Clause 15.
The semiconductor device according to Clause 14, wherein the conductive substrate does not overlap with the first metal component and the second metal component as viewed in a second direction perpendicular to the first direction, and the conductive substrate overlaps with the first semiconductor element and the second semiconductor element as viewed in the second direction.

Clause 16.
The semiconductor device according to Clause 14 or 15, wherein the conductive substrate further includes a third wiring layer and a second insulating layer, and
the second wiring layer and the third wiring layer are laminated with the second insulating layer therebetween.

Clause 17.
The semiconductor device according to Clause 16, wherein the conductive substrate has a first recess extending through the third wiring layer and the second insulating layer in the first direction, and
the second wiring layer has a first exposed part exposed through the first recess.

Clause 18.
The semiconductor device according to Clause 17, further comprising a first connecting member electrically connecting the first semiconductor element and the second wiring layer,
wherein the first connecting member is bonded to the first exposed part.

Clause 19.
The semiconductor device according to Clause 17 or 18, wherein the first recess and the first through hole are connected to each other as viewed in the first direction.

Clause 20.

The semiconductor device according to any one of Clauses 17 to 19, wherein the conductive substrate has a second recess extending through the third wiring layer, the second insulating layer, the second wiring layer and the first insulating layer in the first direction, and the first wiring layer has a second exposed part exposed through the second recess.

Clause 21.

The semiconductor device according to Clause 20, further comprising a second connecting member electrically connecting the second semiconductor element and the first wiring layer, and the second connecting member is bonded to the second exposed part.

The invention claimed is:

1. A semiconductor device comprising:
a first semiconductor element including a first electrode, a second electrode and a third electrode, and controlled to turn on and off a connection between the first electrode and the second electrode by a first driving signal inputted to the third electrode;
a second semiconductor element including a fourth electrode, a fifth electrode and a sixth electrode, and controlled to turn on and off a connection between the fourth electrode and the fifth electrode by a second driving signal inputted to the sixth electrode;
a first metal component on which the first semiconductor element is mounted;
a second metal component on which the second semiconductor element is mounted, the second metal component being spaced apart from the first metal component; and
a conductive substrate including a first wiring layer, a second wiring layer and a first insulating layer laminated such that the first insulating layer is interposed between the first wiring layer and the second wiring layer,
wherein the first wiring layer includes a first power terminal section electrically connected to the first electrode,
the second wiring layer includes a second power terminal section electrically connected to the fifth electrode,
the first power terminal section, the second power terminal section and the first insulating layer overlap with each other as viewed in a first direction that is a thickness direction of the conductive substrate,
the conductive substrate surrounds the first semiconductor element and the second semiconductor element as viewed in the first direction and overlaps with a portion between the first metal component and the second metal component as viewed in the first direction,
the conductive substrate has a first through hole and a second through hole each extending through the conductive substrate in the first direction,
the first metal component is inserted through the first through hole, and
the second metal component is inserted through the second through hole.

2. The semiconductor device according to claim 1, wherein the conductive substrate further includes a third power terminal section electrically connected to the second electrode and the fourth electrode, and the third power terminal section is spaced apart from the first power terminal section and the second power terminal section as viewed in the first direction.

3. The semiconductor device according to claim 2, comprising a resin package covering the first semiconductor element and the second semiconductor element, wherein as viewed in the first direction, the first power terminal section and the second power terminal section are located opposite from the third power terminal section with the resin package intervening therebetween.

4. The semiconductor device according to claim 2, wherein the first wiring layer includes the third power terminal section.

5. The semiconductor device according to claim 1, wherein as viewed in a second direction perpendicular to the first direction, the conductive substrate does not overlap with the first semiconductor element, the second semiconductor element, the first metal component and the second metal component.

6. The semiconductor device according to claim 1, wherein the conductive substrate further includes a third wiring layer and a second insulating layer, and the second wiring layer and the third wiring layer are laminated with the second insulating layer therebetween.

7. The semiconductor device according to claim 6, wherein the conductive substrate further includes an insertion member electrically connecting at least two of the first wiring layer, the second wiring layer and the third wiring layer.

8. The semiconductor device according to claim 7, wherein the insertion member extends through the conductive substrate in the first direction.

9. The semiconductor device according to claim 7, wherein the conductive substrate further includes a through-hole via electrically connecting at least two of the first wiring layer, the second wiring layer and the third wiring layer.

10. The semiconductor device according to claim 9, wherein the through-hole via extends through the conductive substrate in the first direction.

11. The semiconductor device according to claim 9, wherein the insertion member is larger in area than the through-hole via as viewed in the first direction.

12. The semiconductor device according to claim 7, wherein each of the first metal component and the second metal component is larger in area than the insertion member as viewed in the first direction.

13. The semiconductor device according to claim 1, wherein, the first semiconductor element is contained in the first through hole as viewed in the first direction, and the second semiconductor element is contained in the second through hole as viewed in the first direction.

14. The semiconductor device according to claim 13, wherein the conductive substrate further includes a third wiring layer and a second insulating layer, and the second wiring layer and the third wiring layer are laminated with the second insulating layer therebetween.

15. The semiconductor device according to claim 14, wherein the conductive substrate has a first recess extending through the third wiring layer and the second insulating layer in the first direction, and the second wiring layer has a first exposed part exposed through the first recess.

16. The semiconductor device according to claim 15, further comprising a first connecting member electrically connecting the first semiconductor element and the second wiring layer,
   wherein the first connecting member is bonded to the first exposed part.

17. The semiconductor device according to claim 15, wherein the first recess and the first through hole are connected to each other as viewed in the first direction.

18. The semiconductor device according to claim 15, wherein the conductive substrate has a second recess extending through the third wiring layer, the second insulating layer, the second wiring layer and the first insulating layer in the first direction, and
   the first wiring layer has a second exposed part exposed through the second recess.

19. The semiconductor device according to claim 18, further comprising a second connecting member electrically connecting the second semiconductor element and the first wiring layer, and
   the second connecting member is bonded to the second exposed part.

* * * * *